(12) United States Patent
Halahan et al.

(10) Patent No.: US 6,498,381 B2
(45) Date of Patent: Dec. 24, 2002

(54) SEMICONDUCTOR STRUCTURES HAVING MULTIPLE CONDUCTIVE LAYERS IN AN OPENING, AND METHODS FOR FABRICATING SAME

(75) Inventors: Patrick B. Halahan, San Mateo, CA (US); Oleg Siniaguine, San Carlos, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 8 days.

(21) Appl. No.: 09/792,311

(22) Filed: Feb. 22, 2001

(65) Prior Publication Data

US 2002/0115290 A1 Aug. 22, 2002

(51) Int. Cl.$^7$ ................................................ H01L 31/00
(52) U.S. Cl. ...................... 257/449; 257/244; 257/267; 257/280; 257/281; 257/284; 257/385; 257/449; 257/471; 257/476; 257/485; 438/48; 438/570
(58) Field of Search ................................ 257/244, 267, 257/280, 281, 284, 285, 449, 485, 471, 476; 438/570, 48

(56) References Cited

U.S. PATENT DOCUMENTS

| | | | | |
|---|---|---|---|---|
| 4,353,082 A | * | 10/1982 | Chatterjee | 357/23 |
| 4,580,331 A | * | 4/1986 | Soclof | 29/580 |
| 4,694,561 A | * | 9/1987 | Lebowitz | 437/52 |
| 4,810,669 A | * | 3/1989 | Kobayashi | 437/67 |
| 5,016,068 A | * | 5/1991 | Mori | 357/23.5 |
| 5,079,615 A | * | 1/1992 | Yamazaki et al. | 357/51 |
| 5,094,972 A | * | 3/1992 | Pierce et al. | 437/67 |
| 5,317,432 A | * | 5/1994 | Ino | 359/59 |
| 5,385,861 A | * | 1/1995 | Bashir et al. | 437/67 |
| 5,804,478 A | | 9/1998 | Nagata et al. | 438/243 |
| 5,843,844 A | * | 12/1998 | Miyanaga | 438/694 |
| 5,854,501 A | * | 12/1998 | Kao | 257/316 |
| 6,016,012 A | * | 1/2000 | Chatila et al. | 257/775 |
| 6,221,751 B1 | | 4/2001 | Chen et al. | 438/612 |
| 6,322,903 B1 | | 11/2001 | Siniaguine et al. | 428/617 |

FOREIGN PATENT DOCUMENTS

WO    WO 98/19337    5/1998

* cited by examiner

Primary Examiner—Jerome Jackson
Assistant Examiner—Edgardo Ortiz
(74) Attorney, Agent, or Firm—Skjerven Morrill LLP; Michael Shenker

(57) ABSTRACT

In some embodiments, a circuit structure comprises a semiconductor substrate, an opening passing through the substrate between a first side of the substrate and a second side of the substrate, and a plurality of conductive layers in the opening. In some embodiments, one conductive layer provides an electromagnetic shield that shields the substrate from AC signals carried by a contact pad made from another conductive layer on a backside of the substrate. The conductive layers can also be used to form capacitor/rectifier networks. Manufacturing methods are also provided.

50 Claims, 21 Drawing Sheets

SEMICONDUCTOR STRUCTURES HAVING MULTIPLE CONDUCTIVE LAYERS IN AN OPENING, AND METHODS FOR FABRICATING SAME

BACKGROUND AND SUMMARY

The present invention relates to semiconductor technology.

Some embodiments of the invention facilitate creation of electromagnetic shielding for circuit nodes that carry AC (alternating current) signals. Such shielding advantageously reduces energy losses for the AC signals. The shielding also reduces noise in shielded regions.

Some embodiments allow fabrication of capacitors and capacitor networks in a small area.

According to some aspects of the invention, a circuit manufacturing method comprises:

forming an opening in a first side of a semiconductor substrate, with a plurality of conductive layers overlaying each other in the opening, the conductive layers including a first conductive layer and a second conductive layer overlaying the first conductive layer such that the first and second conductive layers either (i) are separated by an insulating layer in the opening, or (ii) form a P-N junction in the opening, or (iii) form a Schottky junction in the opening;

removing material from a second side of the semiconductor substrate to expose the second conductive layer in the opening on the second side of the substrate.

In some embodiments, the first and second conductive layers are separated by an insulating layer in the opening.

In some embodiments, the first conductive layer shields the substrate from AC signals carried by a contact pad made from the second conductive layer on a wafer backside. Contact pads on the wafer backside can facilitate vertical integration and small scale packaging. See PCT publication WO98/19337 (TruSi Technologies, LLC, May 1998) and U.S. patent application Ser. No. 09/456,225 filed Dec. 6, 1999 by O. Siniaguine et al., now U.S. Pat. No. 6,322,903 issued Nov. 27, 2001. Both of these applications are incorporated herein by reference.

In some embodiments, the first and second conductive layers provide conductive plates of a capacitor.

In some embodiments, the invention provides a circuit structure comprising a semiconductor substrate, an opening passing through the substrate between a first side of the substrate and a second side of the substrate, and a plurality of conductive layers which overlay sidewalls of the opening, wherein the conductive layers include a first conductive layer and a second conductive layer such that the first and second conductive layers either (i) are separated by an insulating layer in the opening, or (ii) form a P-N junction in the opening, or (iii) form a Schottky junction in the opening; wherein the second conductive layer is exposed on the second side of the opening, and the first conductive layer surrounds the second conductive layer in the opening.

In some embodiments, a circuit manufacturing method comprises:

forming an opening in a first side of a semiconductor substrate;

forming at least three conductive layers overlaying each other in the opening, such that each two consecutive conductive layers either (i) are separated by an insulating layer in the opening, or (ii) form a P-N junction in the opening, or (iii) form a Schottky junction in the opening;

removing material from a second side of the semiconductor substrate to expose at least one of said conductive layers in the opening on the second side of the substrate.

In some embodiments, a circuit structure comprises:

a semiconductor substrate, and an opening passing through the substrate between a first side of the substrate and a second side of the substrate;

at least three conductive layers overlying each other in the opening, such that each two adjacent conductive layers either (i) form a P-N junction in the opening, or (ii) form a Schottky junction in the opening, or (iii) are separated by an insulating layer in the opening;

wherein one of said conductive layers is exposed on the second side.

In some embodiments, a circuit manufacturing method comprises:

forming an opening in a first side of a semiconductor substrate;

forming a plurality of conductive layers overlaying each other in the opening, the conductive layers including a first conductive layer and a second conductive layer overlaying the first conductive layer such that the first and second conductive layers either (i) form a P-N junction, or (ii) form a Schottky diode junction;

removing material from a second side of the semiconductor substrate to expose at least one of the first and second conductive layers on the second side.

In some embodiments, a circuit structure comprises:

a semiconductor substrate, and an opening passing through the substrate between a first side of the substrate and a second side of the substrate;

a plurality of conductive layers overlaying each other in the opening, the conductive layers including first and second conductive layers which either (i) form a P-N junction in the opening, or (ii) form a Schottky junction in the opening;

wherein at least one of the first and second conductive layers is exposed on the second side.

Other features and advantages of the invention are described below.

BRIEF DESCRIPTION OF THE DRAWINGS

FIGS. 1–4A are vertical cross-sectional views of structures according to the present invention.

FIG. 4B is a horizontal cross-sectional view of the structure of FIG. 4A.

DESCRIPTION OF PREFERRED EMBODIMENTS

The embodiments described in this section illustrate but do not limit the invention. The invention is not limited by any particular materials, dimensions, and fabrication processes.

Figure 1:
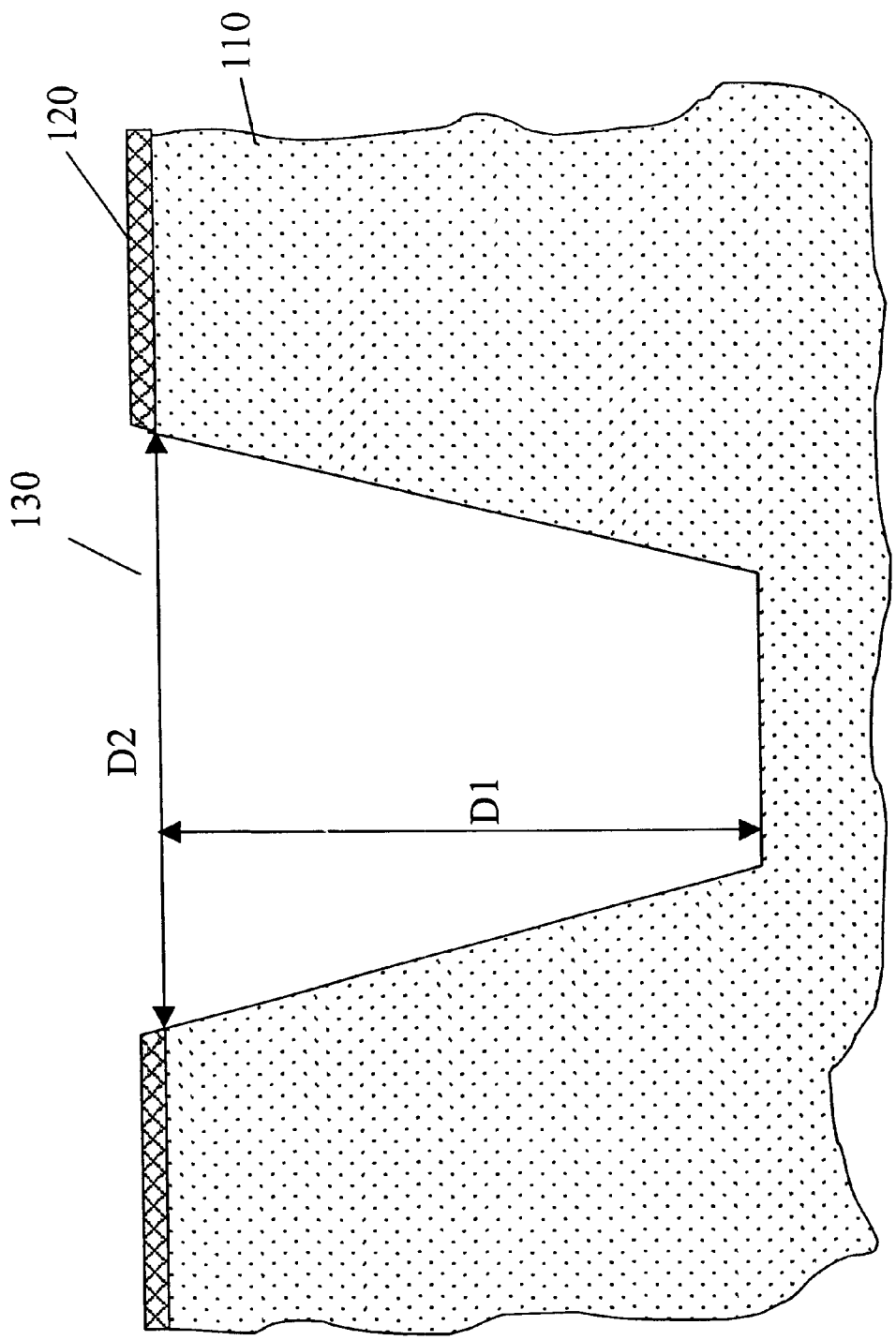

FIG. 1 illustrates a semiconductor wafer 110 which will include one or more backside contact pads. In some embodiments, the wafer has been processed to form transistors, capacitors, resistors, conductive lines, and/or other circuit elements, or portions of circuit elements (not shown). Circuit elements fabricated in, above, or below the substrate 110 can be present. An insulating layer 120 has been formed on the wafer. In some embodiments, insulator 120 is used in other portions of the wafer to form the circuit elements mentioned above. In some embodiments, insulator 120 is omitted.

Then a mask (not shown) is formed on the wafer using a conventional photolithographic process, and one or more openings 130 are etched in the wafer through the insulator 120. The depth of each opening 130 exceeds the final thickness of the wafer at the location of the opening (the wafer will be thinned as described below). The lateral shape and dimensions of each opening 130 correspond to the desired shape and dimensions of a backside contact pad to be formed in the opening. In some embodiments, the depth D1 of each opening 130 is about 100 μm. At least some of the openings 130 are shaped as an inverted truncated cone having a top diameter D2 of 30–50 μm, or an inverted truncated pyramid whose top surface is a square of a side of 30–50 μm. An opening may also be shaped as a non-inverted truncated cone or pyramid or as a cylinder. An opening may have a rounded bottom. For example, hemispherical openings are used in some embodiments. An opening may be elongated (as a groove). Other shapes and dimensions are possible. Different openings 130 may have different shapes and dimensions in the same wafer.

Suitable processes for forming the openings 130 are described in the aforementioned PCT publication WO 98/19337. As described therein, the mask (not shown) for etching the openings can be made of photolithographically patterned aluminum. The invention is not limited to any particular process.

A conductive layer 210 (FIG. 2) is formed over the wafer. Layer 210 will provide electromagnetic shielding in openings 130. Layer 210 overlays the sidewalls of openings 130. Layer 210 can be photolithographically patterned if desired.

Then an insulating layer 310 (FIG. 3) and a conductive layer 320 are formed over the wafer. These layers can be patterned as desired. in some embodiments, the layers 210, 310, 320 completely cover the inner surface (sidewalls and bottom) of each opening 130.

Optionally, the openings 130 can be completely or partially filled by some material 340 for increased mechanical strength and, possibly, increased electrical and thermal conductivity. Both conductive and insulating materials can be used. See the aforementioned PCT publication WO 98/19337. In other embodiments, the openings are filled with a plug made from layer 320. In other embodiments, the openings are not filled.

Figure 2:
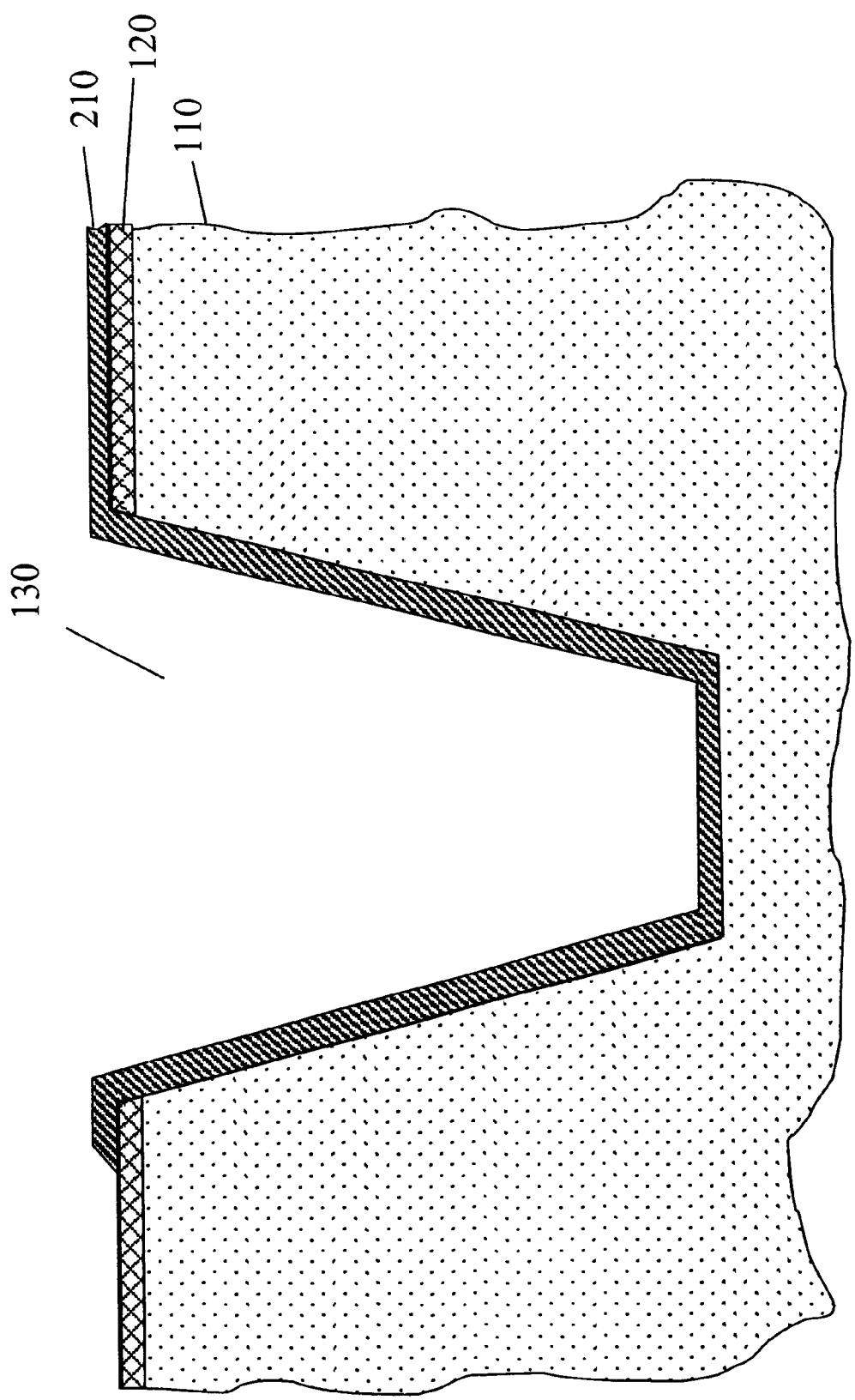
Figure 3:
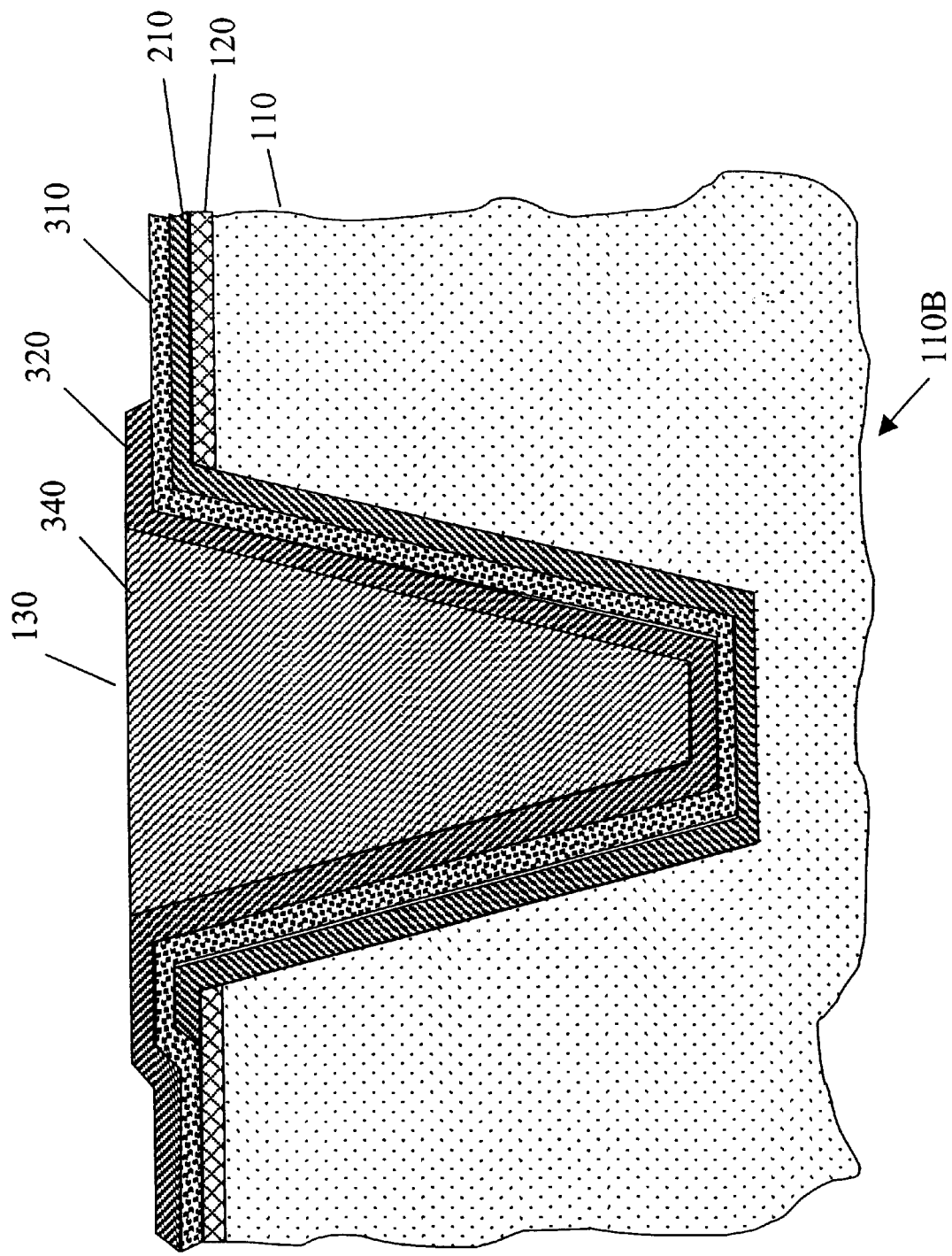

The processes illustrated in FIGS. 1–3 (formation of openings 130 and layers 120, 210, 310, 340, and the patterning steps) can be used to fabricate other circuit elements in the wafer, and/or can be intermixed with steps fabricating other circuit elements.

Figure 4:
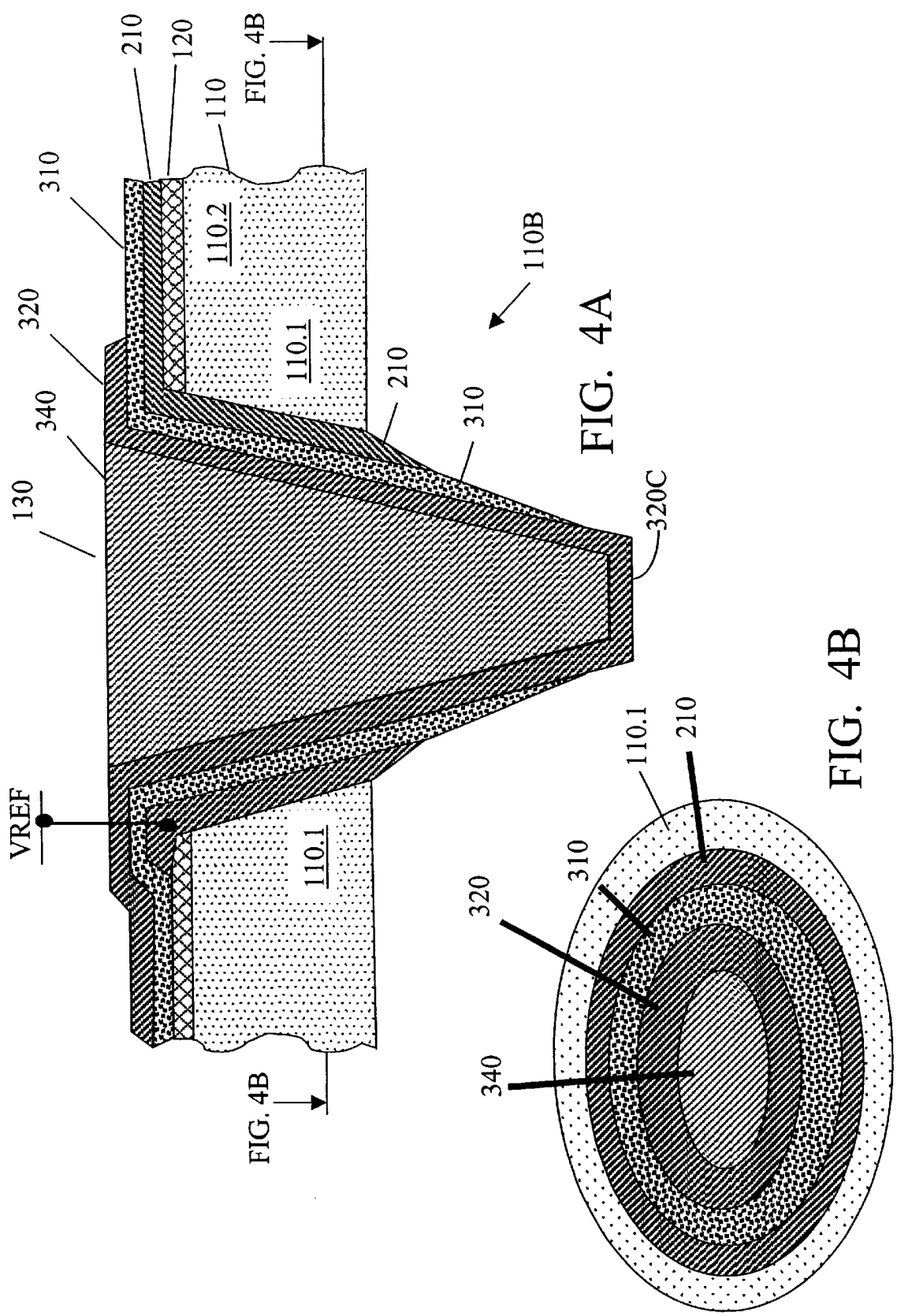

Then the structure is thinned from the backside 110B. Openings 130 become exposed (see FIG. 4A). Layers 210 and 310 are removed at the bottoms of openings 130 but remain on the sidewalls. Layer 320 is exposed on the wafer backside. In some embodiments, layer 320 covers the sidewalls of openings 130, and each of layers 310, 210 surrounds the layer 320 in the openings, as shown in the horizontal cross sectional view of FIG. 4B.

The bottom portion 320C of layer 320 provides a contact pad that can be bonded to a wiring substrate (e.g. a printed circuit board) or to another integrated circuit. See U.S. patent application Ser. No. 09/456,225, filed Dec. 6, 1999 by O. Siniaguine et al., entitled "PACKAGING OF INTEGRATED CIRCUITS AND VERTICAL INTEGRATION", incorporated herein by reference.

In operation, contacts 320C may serve as input, output, or input/output terminals carrying AC (alternating current) signals. Layer 210 shields the substrate 110 from the electromagnetic field generated by these signals. The shielding reduces signal attenuation and substrate noise. Conductive shields 210 can be held at a constant potential VREF, as schematically shown in FIG. 4A. VREF can be ground, VCC, or some other value. Each conductive shield 210 in an opening 130 physically contacts a surrounding region 110.1 of substrate 110. Conductive shields 210 in different openings 130 can be at different potentials in the same integrated circuit.

Region 110.1 can be at the same potential VREF as the adjacent shield 210 or at a different constant or variable potential. In some embodiments, the regions 210, 110.1 form a diode reverse biased during operation.

FIG. 4A illustrates a region 110.2 in substrate 110. Region 110.2 can be a transistor region (source, drain, channel, emitter, etc.) or any other type of region. Region 110.2 can carry an AC signal. Region 110.2 is shielded by layer 210 from signals on pads 320C. Region 110.2 may be isolated from region 110.1 by one or more P-N junctions.

The integrated circuit may have other backside contacts (not shown) which do not have a conductive shield around them. These contacts can be manufactured from layer 320 at the same time as the shielded contacts 320C. The non-shielded contacts are manufactured in openings (not shown) formed at the same time as openings 130, but layer 210 is etched out of these openings when this layer is patterned. In some embodiments, non-shielded contacts carry a DC voltage, e.g. they serve as power supply or ground terminals. In some embodiments, non-shielded contacts carry low frequency signals. The invention is not limited to a particular use of shielded or non-shielded contacts.

We now describe particular materials and processing techniques used in some embodiments. Conductive layers 210, 320 can be made of metals, doped polysilicon, conductive metal suicides, and their combinations. Insulating layers 120, 310, 340 can be made of silicon dioxide, silicon nitride, silicon oxynitride, aluminum oxide, tantalum oxide, titanium oxide, and their combinations. Layers 210, 320, 120, 310 can be fabricated by known techniques, such as sputtering, thermal oxidation, or CVD (chemical vapor deposition). Other materials and fabrication techniques, known or to be invented, can also be used. Each of layers 210, 320, 120, 310, 340 can include multiple layers and multiple materials. In some embodiments, layer 210 includes a layer that has a higher conductivity than the adjacent semiconductor regions 110.1.

In some embodiments, the wafer thinning is a blanket etch process. When layers 210, 310 become exposed, the etch continues and etchs the substrate 110 and the layers 210, 310 at the same time. In FIG. 4A, insulator 310 protrudes down after the etch from the backside surface of substrate 110. The protruding insulator helps insulate the substrate from contact pads 320C when the contact pads are bonded to a wiring substrate or another integrated circuit. Conductor 210 also protrudes down from substrate 110, but insulator 310 protrudes more to improve insulation between conductors 210, 320. This profile is achieved by choosing the materials and the etching process so that the etch rate of wafer 110 is higher than the etch rate of layer 210 and the etch rate of layer 210 is higher than the etch rate of insulator 310. The layer 320 has the lowest etch rate (zero for example). In some embodiments, the etch is performed by fluorine containing plasma at atmospheric pressure. A suitable etcher is type Tru-Etch 3000 (Trademark) available from Tru-Si Technologies, Inc., of Sunnyvale, California. Wafer 110 is made of monocrystalline silicon. Conductor 210 is made of titanium, tungsten, molybdenum, vanadium, or their silicides, or titanium nitride, or a combination of these materials. Insulator 310 is made of silicon dioxide, silicon nitride, silicon oxynitride, or a combination of these materials. Conductor 320 is formed, or includes a layer formed, of aluminum, copper, nickel, or a combination of these materials.

Figure 5:
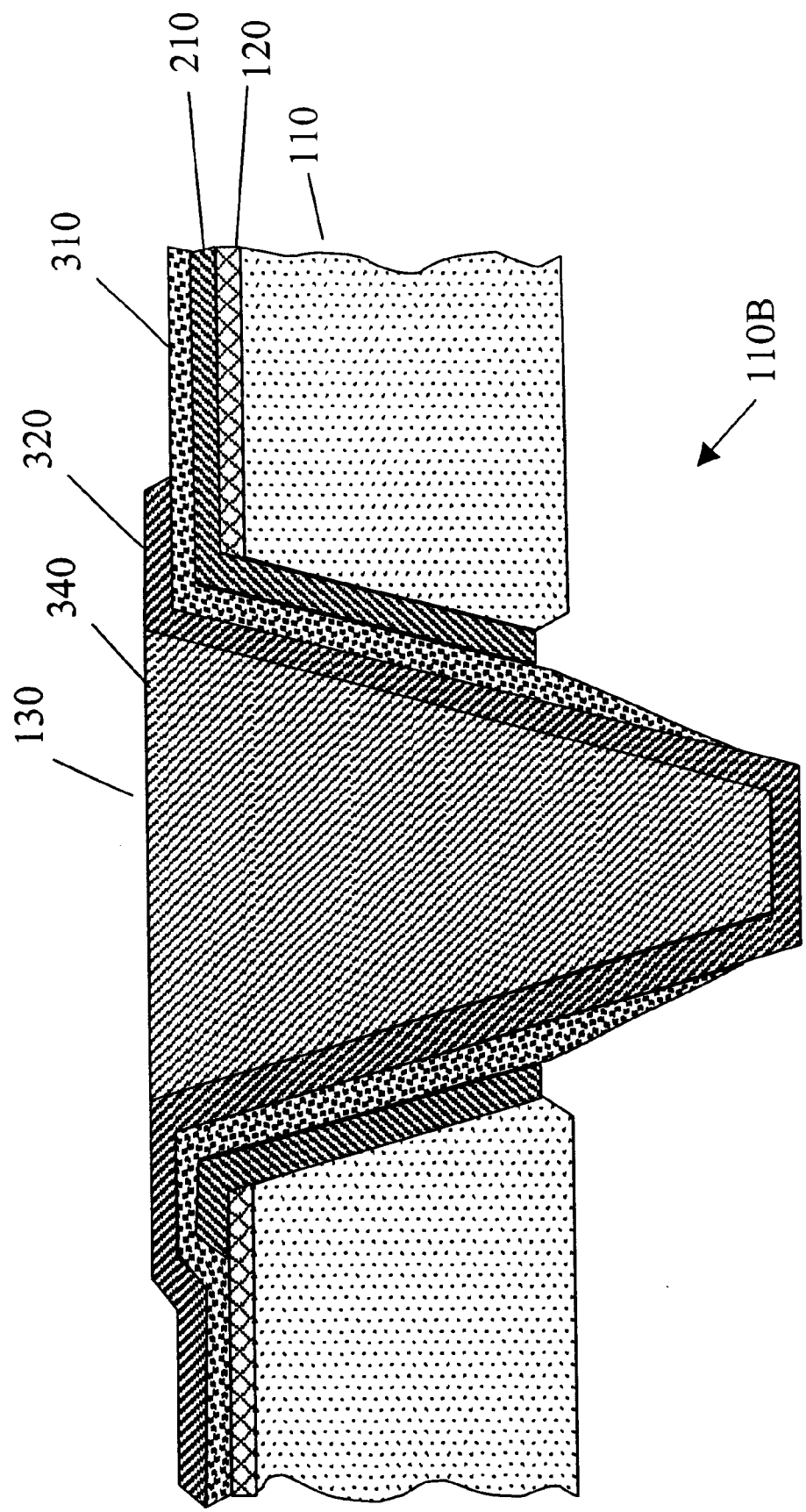
FIGS. 5–17 are vertical cross-sectional views of structures according to the present invention.

FIG. 5 illustrates another embodiment. The same etch is used as in FIG. 4A, but the conductor 210 is etched faster than substrate 110 and insulator 310. For example, the substrate 110 can be monocrystalline silicon and the layer 210 can be doped polysilicon. The remaining materials can be as in FIG. 4A. Polysilicon is initially etched faster than monocrystalline silicon 110, but when polysilicon becomes recessed relative to silicon 110, the polysilicon etch rate may decrease if the recess is narrow, i.e. if the layer 210 is thin. In some embodiments, each of layers 120, 210, 310, 320 is about 1 $\mu$m thick, and each opening 130 is about 100 $\mu$m deep and 30 to 50 $\mu$m wide.

The structure of FIG. 5 is advantages because it facilitates insulation of layer 210 on the wafer backside. The invention is not limited to any etch rates or etching processes.

In some embodiment, layer 210 is a highly doped conductive region of substrate 110. Layer 210 can be created by ion implantation or dopant diffusion before or after formation of openings 130. Alternatively, layer 210 can be formed when substrate 110 is created. For example, layer 210 can be an epitaxial layer in substrate 110. Layer 210 can also be formed by a combination of the techniques mentioned above (ion implantation, epitaxial layer, etc.). Of note, layer 210 does not need to extend to the bottom of openings 130 because the bottoms of openings 130 are removed during wafer thinning. Layer 210 may cover all or part of the sidewalls of the openings 130 after the structure has been thinned.

In some embodiments, the resistivity of layer 210 is at most $100 \times 10^{-6}$ $\Omega$.cm, or at most $90 \times 10^{-6}$ $\Omega$.cm, or at most $50 \times 10^{-6}$ $\Omega$.cm, or at most $10 \times 10^{-6}$ $\Omega$.cm. These ranges are exemplary and not limiting.

In some embodiments, the wafer thinning includes multiple stages. At first, wafer 110 is thinned by etching, mechanical grinding, and/or some other process. Conductor 210 becomes exposed at the bottom and possibly at the sides of openings 130 but conductor 210 does not have to be etched at this stage. Conductor 210 is etched at a later stage by a separate process. Substrate 110 and insulator 310 may be etched at this later stage and/or at a subsequent stage. Photolithographic masking can be used at any or all of these stages to obtain desired etch selectivity. Some embodiments do not use photolithographic masking.

When the structure has been thinned, an insulator 602 (FIG. 6) is formed on wafer backside 110B. The portions of layer 602 on substrate 110, conductor 210, and conductor 320 are marked respectively as 602.110, 602.210, 602.320. In some embodiments, insulator 602 is formed by processing the wafer backside with oxygen or nitrogen to form oxygen or nitrogen compounds 602.110, 602.210, 602.320 (for example, silicon oxide or nitride and metal oxides or nitrides). Oxygen or nitrogen plasma processing can be used. Masking is not needed. Later, the insulator 602.320 on contacts 320C can be removed without removing the insulators 602.110, 602.210. In some embodiments, the insulator 602.320 is removed without masking. For example, the insulator 602.320 is removed by a solder flux that does not attack the insulators 602.110, 602.210. In one such embodiment, layer 320 is copper, or includes a copper sub-layer on the bottom; layer 210 is titanium; substrate 110 is silicon; and insulator 602 is formed with oxygen. Solder fluxes are known that will remove copper oxide but not silicon oxide or titanium oxide.

If substrate 110 is made of an insulating material, the insulator 602.110 will not necessarily be formed. Insulator 610 may or may not be formed on insulator 310. In other embodiments, insulator 602 can be grown on substrate 110 but not on conductor 210 depending on the materials and processes used.

Figure 7:
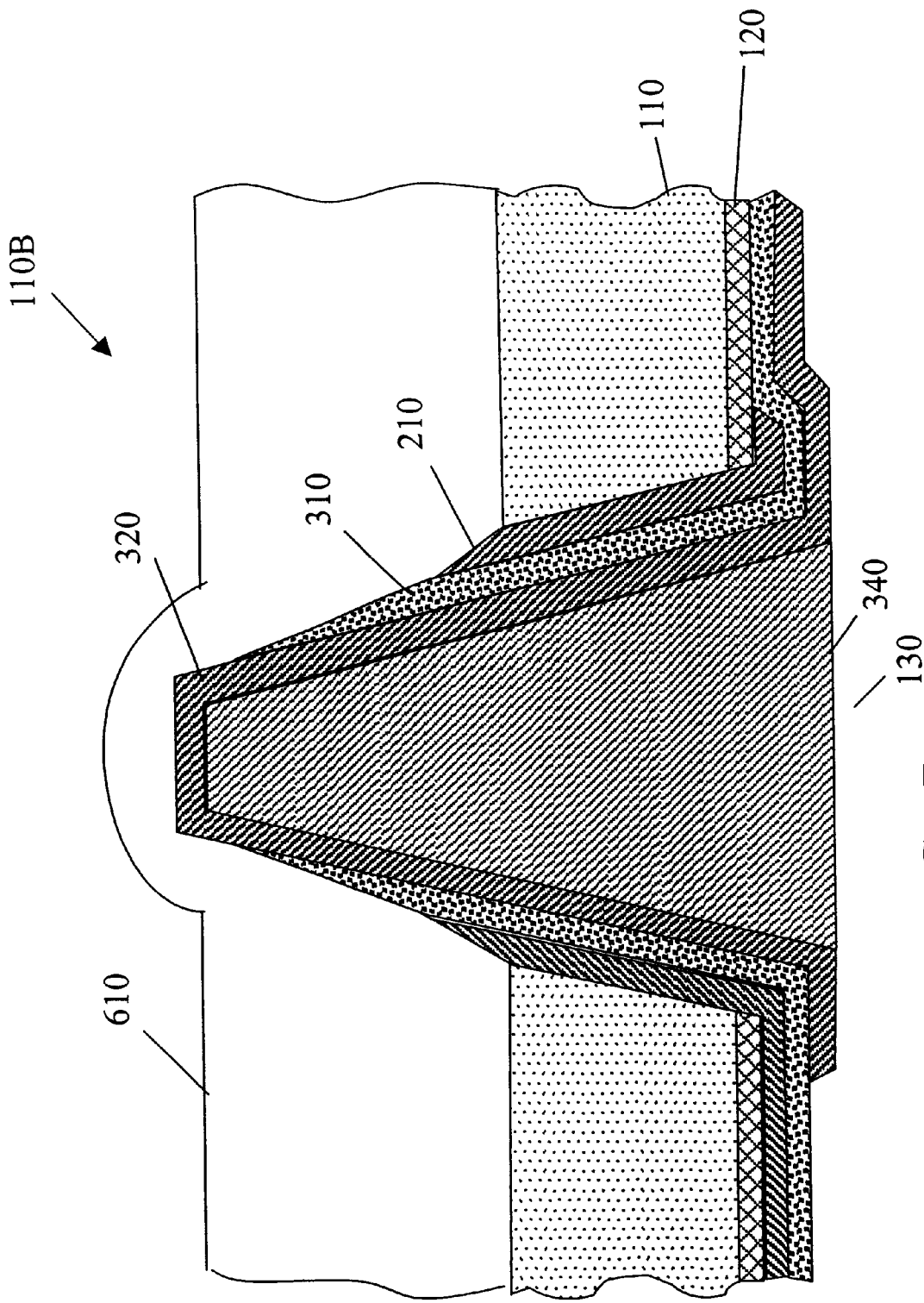
Figure 8:
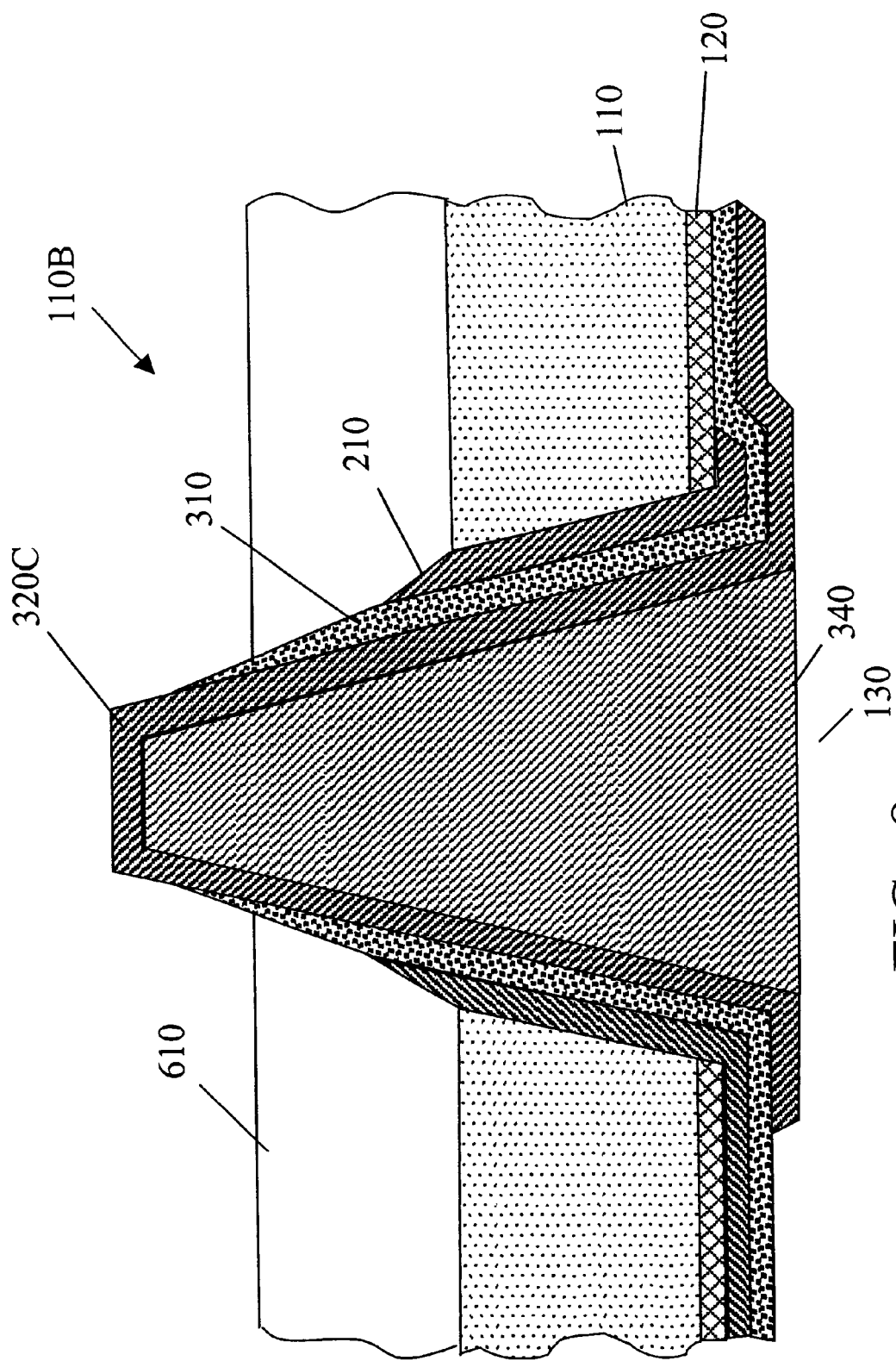

Another suitable process for insulating the wafer backside is illustrated in FIGS. 7–8. The structure is positioned with the backside 110B facing up, and a flowable material 610 is deposited on the backside by a spin-on or spraying process. Suitable materials include glass, polyimide, flowable thermosetting polymers, or other materials which can be deposited by a spin-on or spraying process and which are dielectric when cured. Low viscosity materials are particularly suitable but not necessary. See the aforementioned U.S. patent application Ser. No. 09/456,225. In FIG. 7, layer 610 covers the contacts 320C, but layer 610 is thinner over the contacts 320C than over the rest of the wafer. In other embodiments, layer 610 does not cover the contacts 320C.

Layer 610 is cured, and then etched by a blanket etch until the contacts 320C are exposed. See FIG. 8. Conductor 210 remains covered by layer 610. The etch can be omitted if layer 610 did not cover the contact 320C when the layer 610 was initially deposited.

In some embodiments, the thickness of layer 610 over contacts 320C at the stage of FIG. 7 is about 1 to 10 $\mu$m; contacts 320C protrude by about 5 to 50 $\mu$m (measured vertically) over the backside (top) surface of substrate 110; insulator 310 protrudes by about 1 to 40 $\mu$m; conductor 210 protrudes by about 3 to 30 $\mu$m.

Figure 6:
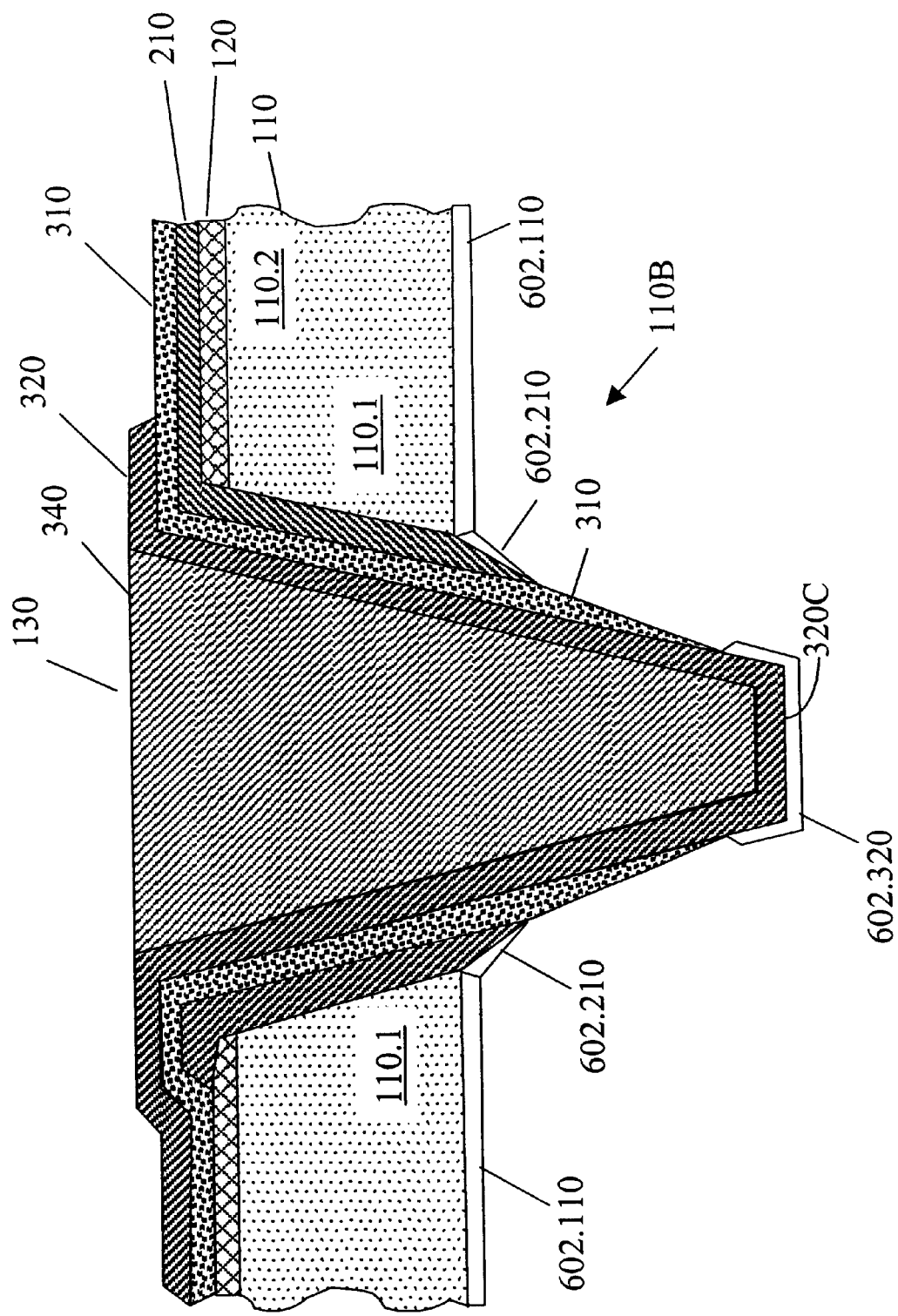

Some embodiments combine the processes of FIGS. 6–8. Insulator 602 is formed as in FIG. 6, then insulator 610 is formed as in FIGS. 7–8. In other embodiments, insulator 610 is formed first. The etch of insulator 610 (FIG. 8) may or may not expose the conductor 210. Then insulator 602 is grown to assure insulation of conductor 210 on the wafer backside.

An advantage of the processes of FIGS. 6–8 is that no photolithography is needed. Other embodiments use photolithography. For example, insulator 610 can be formed from a flowable or non-flowable material, and patterned photolithographically to expose the contacts 320C but not the conductor 210 or substrate 110.

Figure 9:
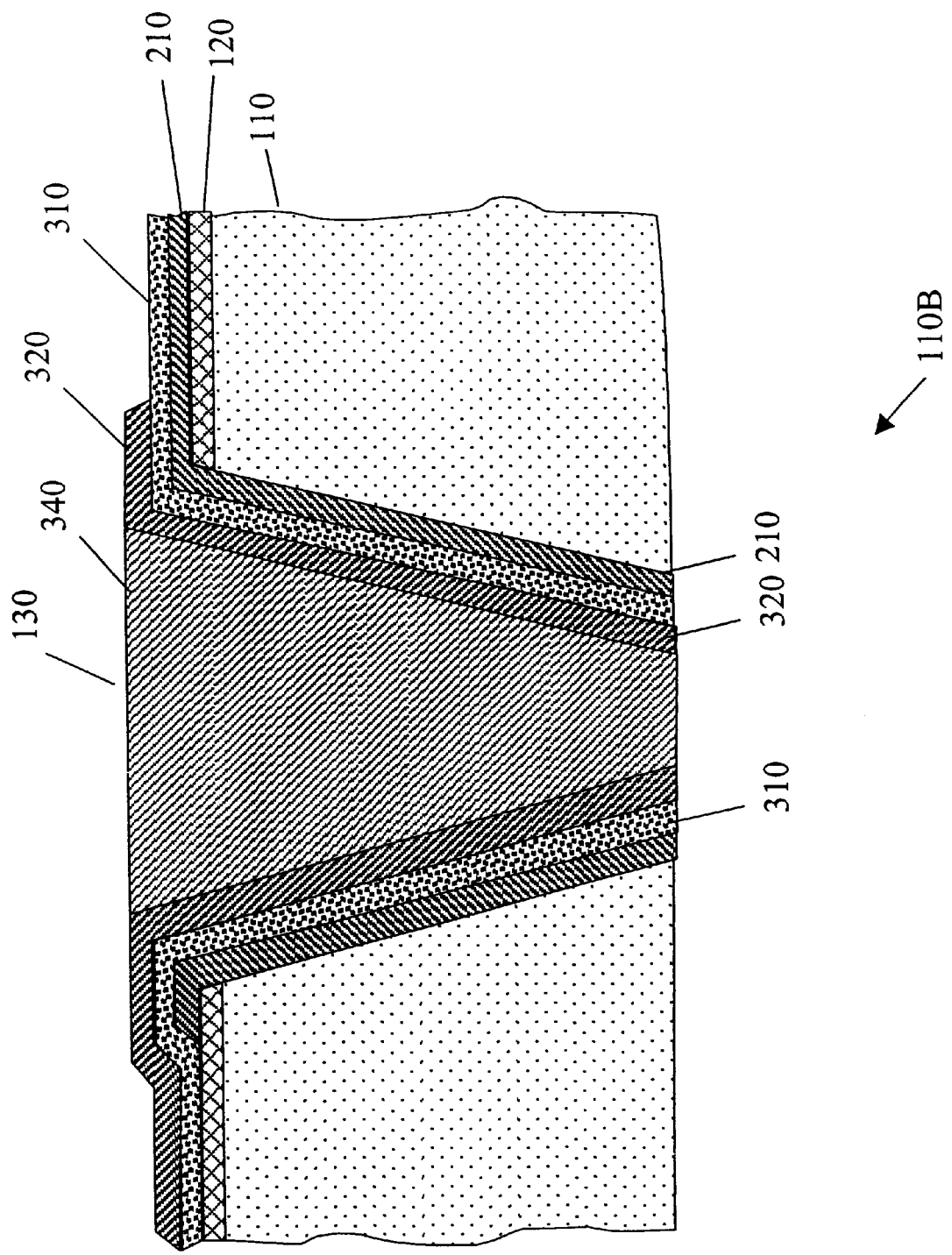
Figure 10:
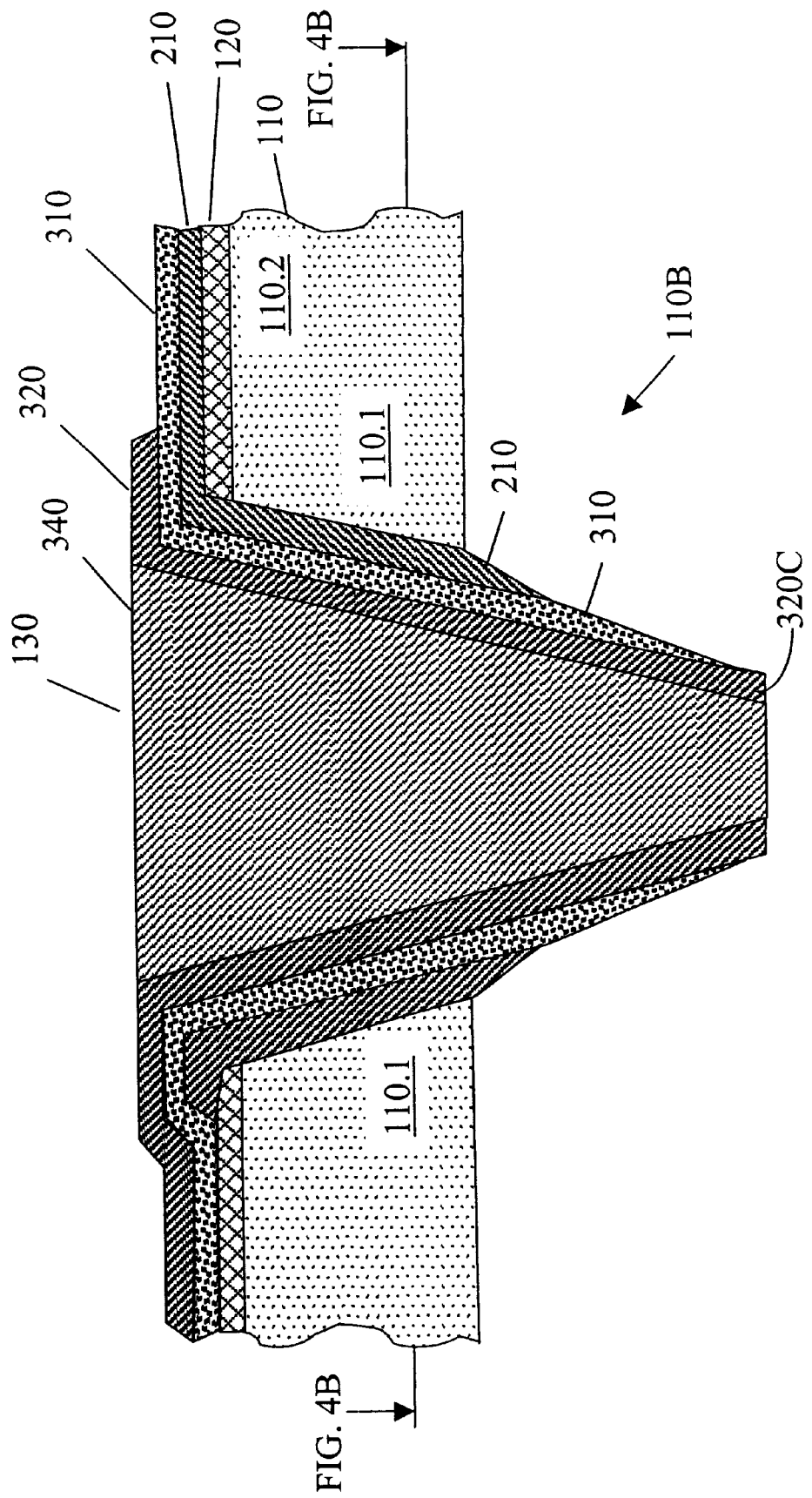

FIGS. 9 and 10 illustrate another thinning technique. A mechanical process such as mechanical grinding or chemical mechanical polishing exposes the conductor 320 on the backside 110B. In FIG. 9, the mechanical process removes the conductor 320 from the bottom of openings 130, so that the filler 340 is exposed. In some embodiments, a wet or dry etch is used to expose the conductor 320, and then a mechanical process is used to remove conductor 320 from the bottom of openings 130. Other combinations of processes are possible. In FIG. 9 the wafer backside is flat because all of the materials are removed at the same rate, though this is not necessary.

Then the wafer backside is etched by a process which etches the materials 110, 210, 310 faster than the conductor 320 and the filler 340 (FIG. 10). The etching processes described above in connection with FIGS. 4A, 4B, and 5 can be used to achieve a profile similar to that of FIG. 4A or 5. Before the etch, the wafer backside can be cleaned to remove any particles of materials 320, 340 from the surface of substrate 110. The particles of materials 320, 340 could be carried onto the back surface of substrate 110 by the mechanical process described above in connection with FIG. 9, especially if the materials 340 and 320 are soft (for example, copper). As indicated above, the filler 340 can be omitted, or can be part of layer 320.

After the etch, the wafer backside can be insulated by any of the processes described above in connection with FIGS. 6–8.

Figure 11:
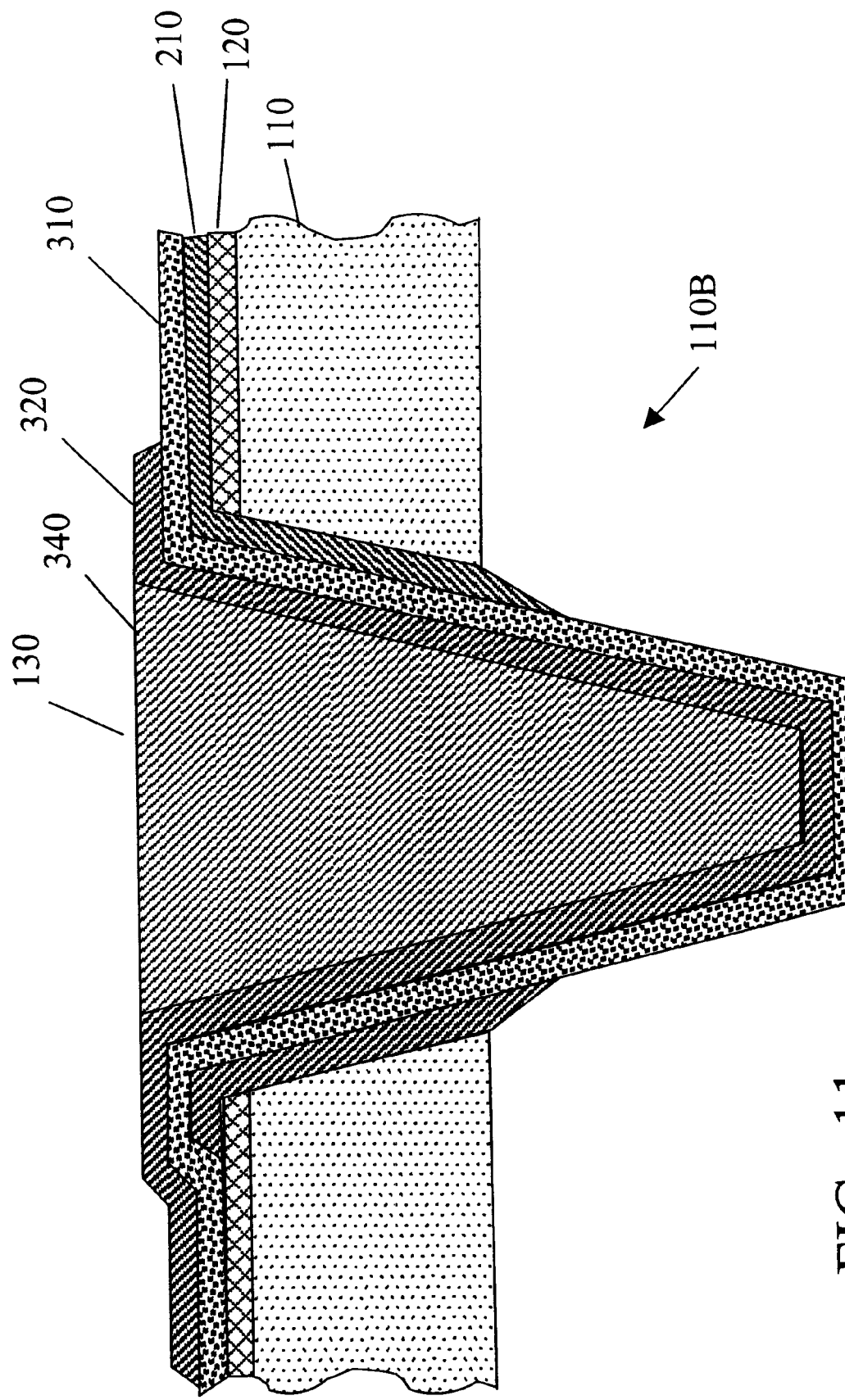
Figure 12:
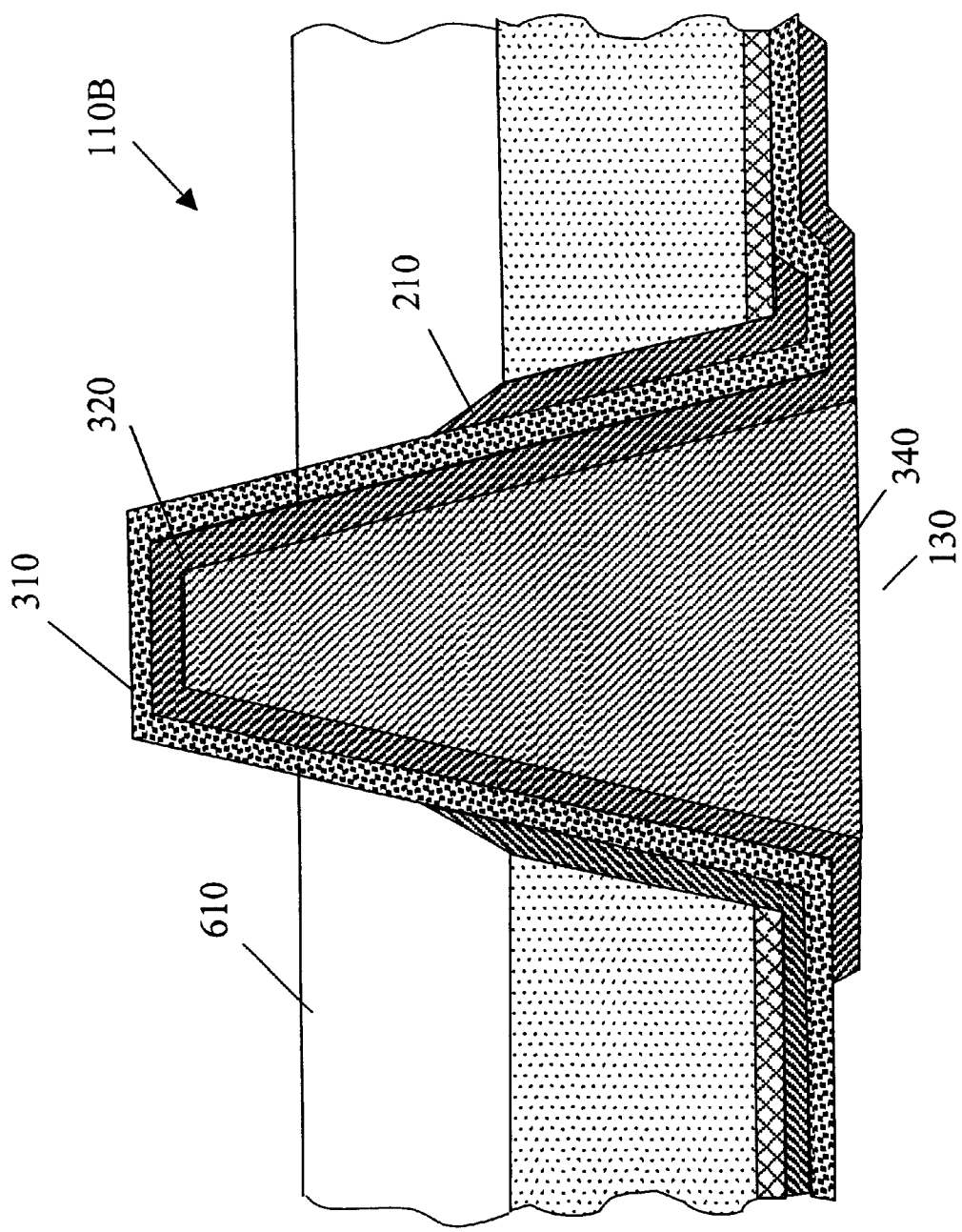
Figure 13:
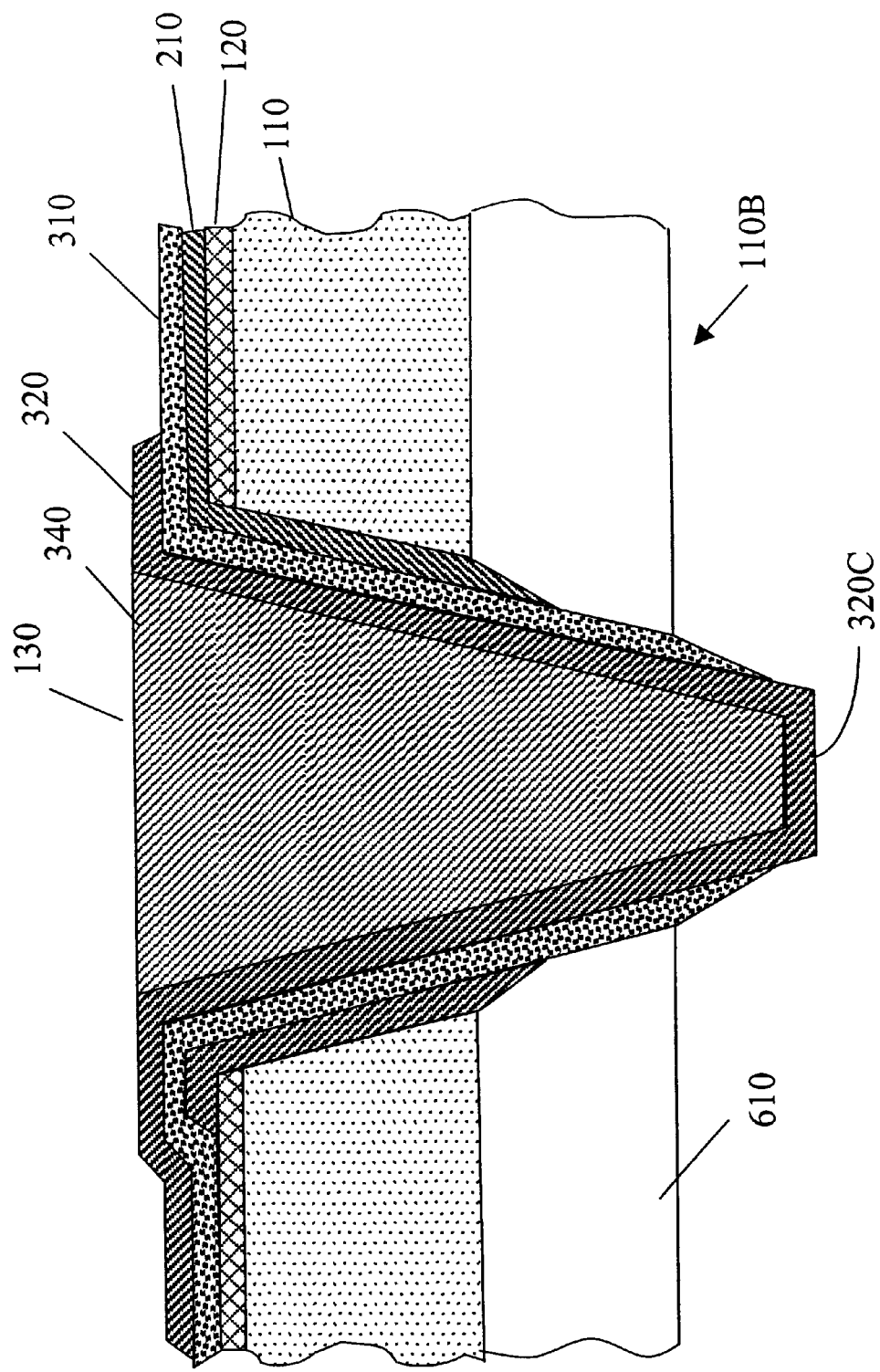

FIGS. 11–13 illustrate another thinning technique. At first, the thinning operation removes a portion of substrate 110 and conductor 210, but the insulator 310 still covers the conductor 320. Suitable processes for this operation include mechanical grinding of substrate 110, followed by an atmospheric pressure etch in a fluorine containing plasma such as described above in connection with FIGS. 4A, 5. In one embodiment, insulator 310 is silicon dioxide. Silicon dioxide can be etched about 8–10 times slower than monocrystalline silicon. In other embodiments, insulator 310 is aluminum oxide, titanium oxide, or $Al_x Ti_y O_z$. These compounds can be wet-etched by known techniques. Other compounds, compositions, and processes are possible.

Then insulator 610 (FIG. 12) is fabricated as described above in connection with FIGS. 7–8. For example, a flowable material is spun or sprayed on the wafer backside, then cured, and then etched with a blanket etch. The etch is selective to insulator 310 so that the conductor 320 is not exposed. In some embodiments, insulator 610 is polyimide etched in oxygen plasma at atmospheric pressure in a Tru-Etch 3000 etcher; insulator 310 is silicon dioxide. Insulator 310 and conductor 320 protrude from the top surface of insulator 610.

Then insulator 310 is etched off the contacts 320C (FIG. 13). This etch does not remove the insulator 610 if insulator 610 is sufficiently thick and/or the etch is sufficiently selective to insulator 610. To obtain selectivity, insulator 610 can be polyimide, insulator 310 can be silicon dioxide, and the etch can be performed in a fluorine containing plasma (e.g., at atmospheric pressure in a Tru-Etch 3000 etcher). Photolithography can also be used to achieved desired selectivity. Some embodiments do not use photolithography.

In some embodiments, fabrication of insulator 610 is preceded, or followed, by fabrication of insulator 602 (FIG. 6). Insulator 602 can be formed before or after the etch of insulator 310 (FIG. 13).

When the wafer fabrication has been completed, the wafer can be diced to provide a number of individual integrated circuits. Alternatively, the whole wafer can be a single integrated circuit.

Figure 14:
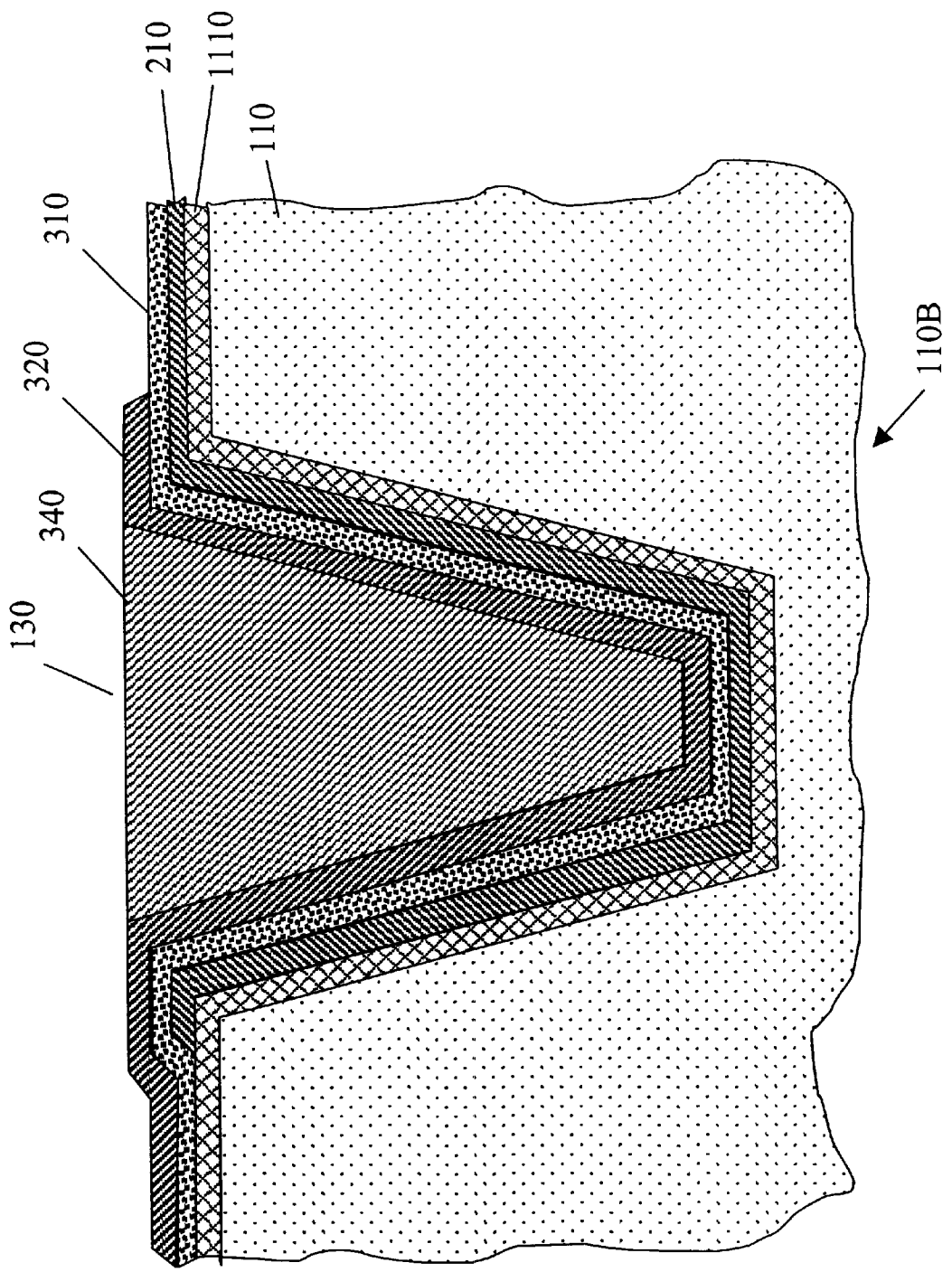

FIG. 14 illustrates another embodiment. After the openings 130 have been formed, an insulating layer 1110 is fabricated over the wafer. Then conductive layer 210 is fabricated that will provide electromagnetic shielding. Insulator 1110 insulates the substrate 110 from conductor 210. Suitable insulators include silicon dioxide, BPSG, silicon nitride, and other insulating materials, known or to be invented. The insulator can be formed by thermal oxidation, CVD (chemical vapor deposition), or other techniques, known or to be invented.

Insulator 1110 can be patterned as needed.

Layers 210, 310, 320, and optionally 340 are formed as described above in connection with FIGS. 1–13.

Figure 15:
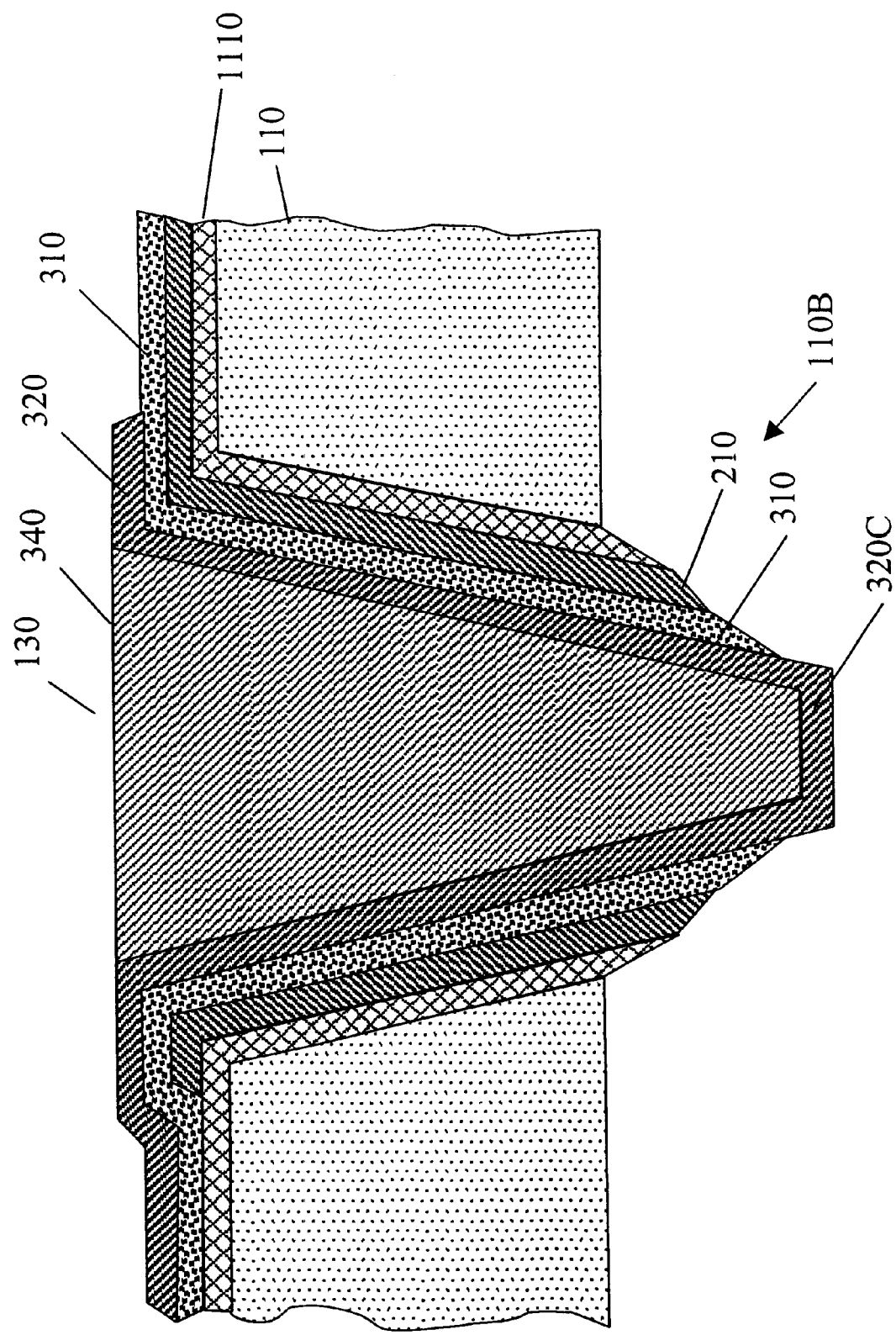

Then the structure is thinned by any of the techniques described above in connection with FIGS. 1–13. FIG. 15 illustrates the structure thinned by an etch described above in connection with FIG. 4A. Insulator 1110 is etched off the conductor 210 on backside 110B by this etch. In some embodiments, the etch rate of insulator 1110 is the same as for insulator 310, though this is not necessary. The two insulators can be formed from identical materials. The remaining fabrication steps, including fabrication of insulators 602, 610, can be as described above in connection with FIGS. 1–13.

In some embodiments, before the conductor 210 is fabricated, insulator 1110 is removed from some, but not all, of openings 130. As a result, conductor 210 contacts substrate 110 in some, but not all, of the openings. Layer 210 can be patterned so that the shields 210 in different openings are insulated from each other.

Figure 16:
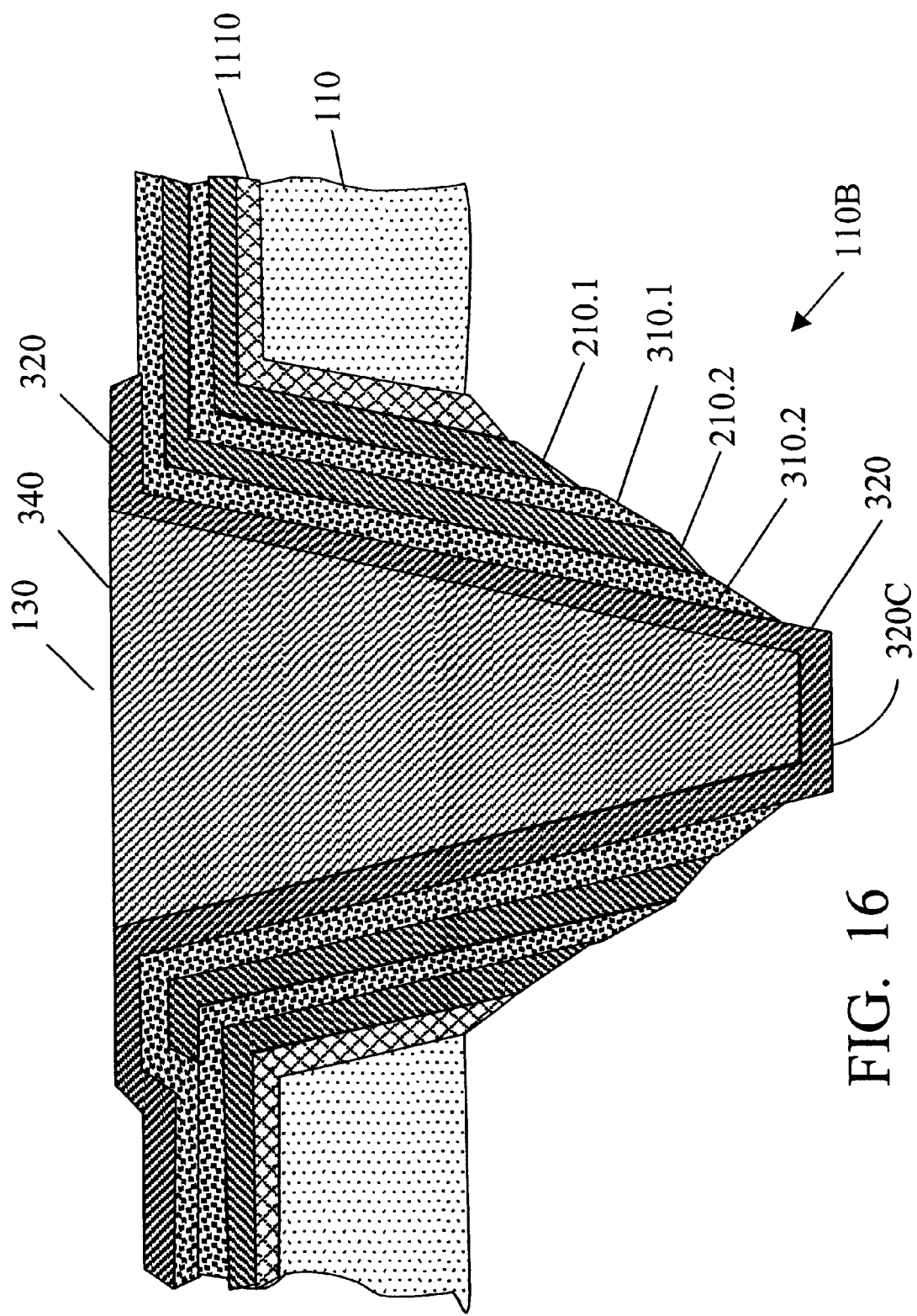

Some embodiments include multiple shield layers. In FIG. 16, two conductive shield layers 210.1, 210.2 are present. After the openings 130 are formed, insulator 1110 is fabricated as described above in connection with FIG. 14. (Insulator 1110 is omitted in some embodiments, or is fabricated but etched out of some, but not all, of openings 130.) Then conductive layer 210.1, insulating layer 310.1, conductive layer 210.2, insulating layer 310.2, and conductive layer 320 are fabricated, in that order. These layers are patterned as desired. For example, layer 210.1 or 210.2 can be etched out of some, but not all, of the openings, so that some openings will have only one shield layer (210.1 or 210.2 but not both). Then the wafer is thinned so that the conductor 320 becomes exposed on the wafer backside. Then insulators 602 and/or 610 are formed as described above, to insulate the wafer backside but expose the contacts 320C. More than two shield layers can be used. One or more of the shield layers can be recessed as in FIG. 5. In operation, each shield 210.1, 210.2 can be held at a constant potential, as described above in connection with FIG. 4A. Multiple shield layers improve electromagnetic shielding.

Figure 17:
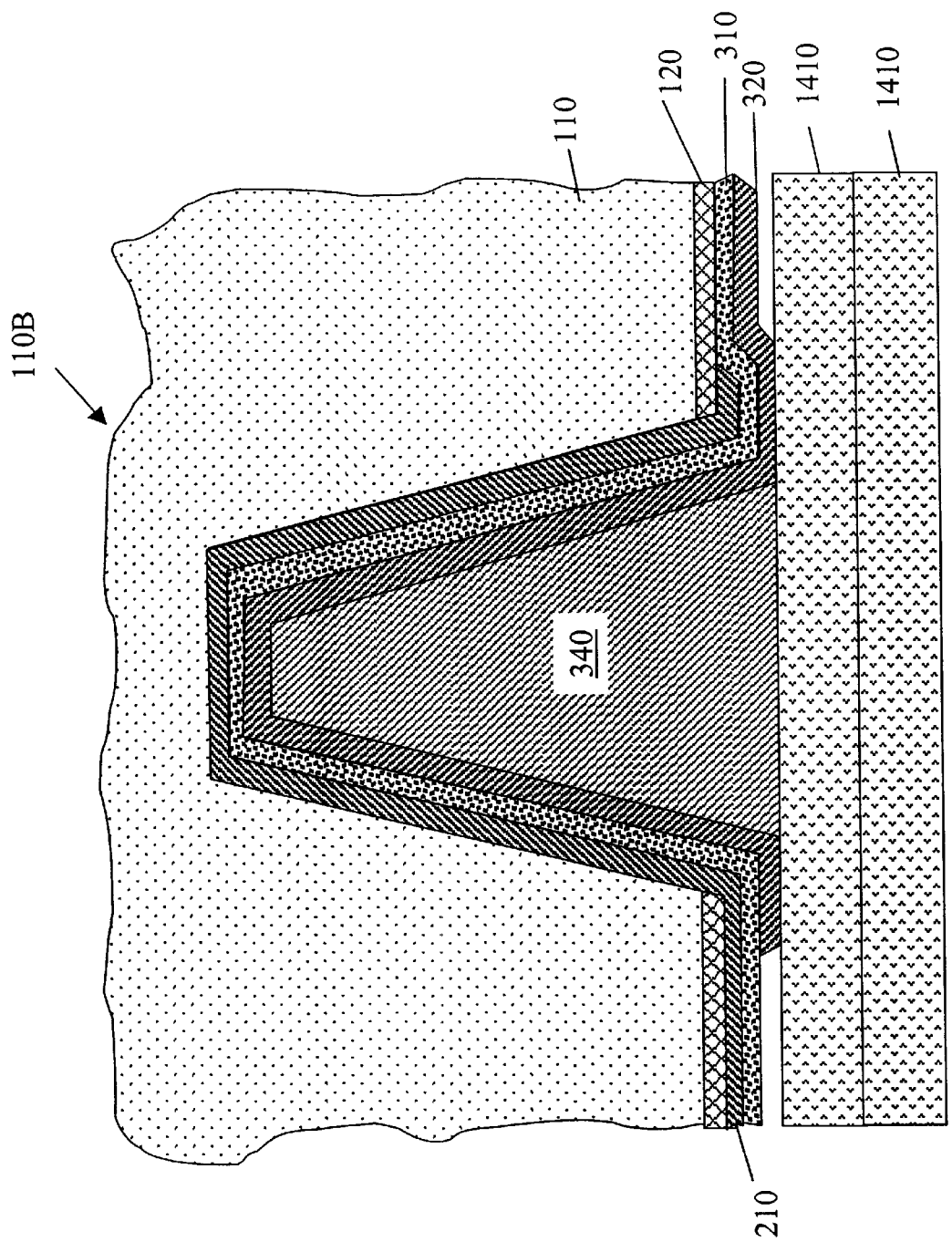

As illustrated in FIG. 17, before the wafer is thinned, the wafer front side can be bonded to one or more substrates 1410 to form a vertically integrated structure. One or more of the substrates 1410 may include circuitry. See the aforementioned U.S. patent application Ser. No. 09/456,225. Alternatively, a substrate 1410 can be used for protection only. Substrates 1410 will protect the circuitry at the front side of wafer 110 during the thinning of wafer 110 and subsequent processing steps.

Figure 18:
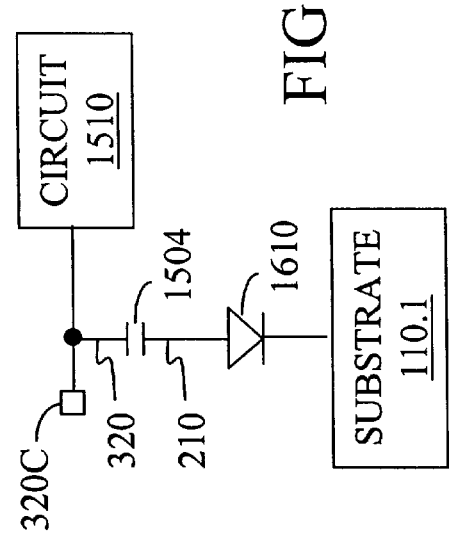
FIGS. 18–22 are circuit diagrams corresponding to structures according to the present invention.

This technology can be used to create capacitor and/or rectifier networks at contact pad 320C. FIG. 18 illustrates a circuit diagram obtained in FIGS. 4A–13. Conductive layers 210, 320 and insulator 310 form a capacitor 1504. The capacitor can be used as a bandpath filter, for example.

In FIG. 18, pad 320C is connected to a circuit 1510 formed in substrate 110. In some embodiments, pad 320 is not connected to such a circuit, but conductor 210 is. In some embodiments, both pad 320C and conductor 210 are connected to such circuits.

Capacitor 1504 can be a junction capacitor or a rectifier. Insulator 310 can be omitted. Layers 320, 210 can be semiconductor layers of opposite conductivity types to form a P-N junction. Alternatively, the two layers can form a Schottky junction if one of the two layers is an N-type semiconductor layer and the other one of the two layers is a metal layer.

Figure 19:
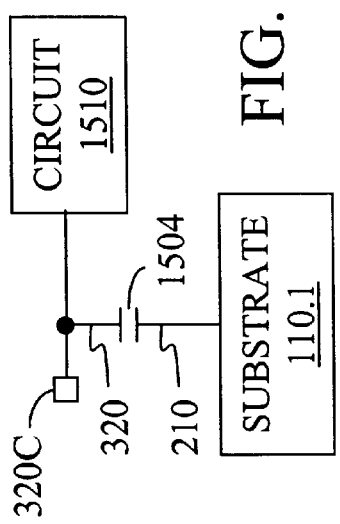
Figure 20:
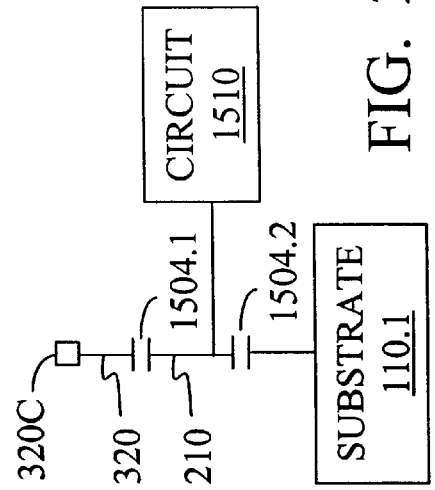

In each of FIGS. 19, 20, conductor 210 and substrate 110 form a diode 1610. (Layer 210 serves as the anode in FIG. 19, as the cathode in FIG. 20.) Diode 1610 is a P-N junction diode if conductor 210 and the adjacent region 110.1 of substrate 110 are semiconductor materials of opposite conductivity types. Diode 1610 is a Schottky diode if layer 210 is metal and region 110.1 is N type. Pad 320C, layer 210, and/or substrate region 110.1 can be connected to circuits formed in substrate 110, such as circuit 1510.

Figure 21:
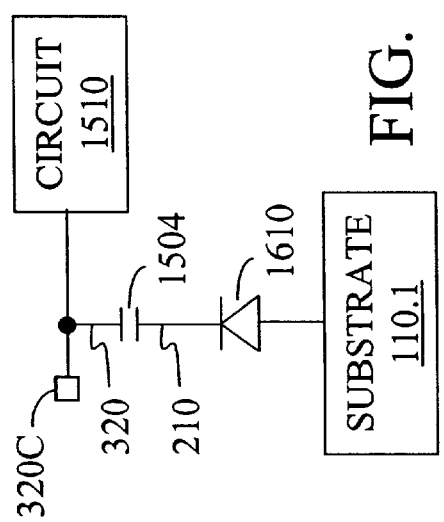

FIG. 21 is a circuit diagram for the structure of FIG. 15. Capacitor 1504.1 is formed like capacitor 1504 in FIG. 18. Capacitor 1504.2 is formed by conductor 210, substrate region 110.1, and insulator 1110. Substrate region 110.1 is doped to achieve desired conductivity.

Any or both of capacitors 1504.1, 1504.2 can be junction capacitors or rectifiers as described above in connection with FIGS. 18–20. Insulating layers 310 and/or 1110 can be omitted.

Figure 22:
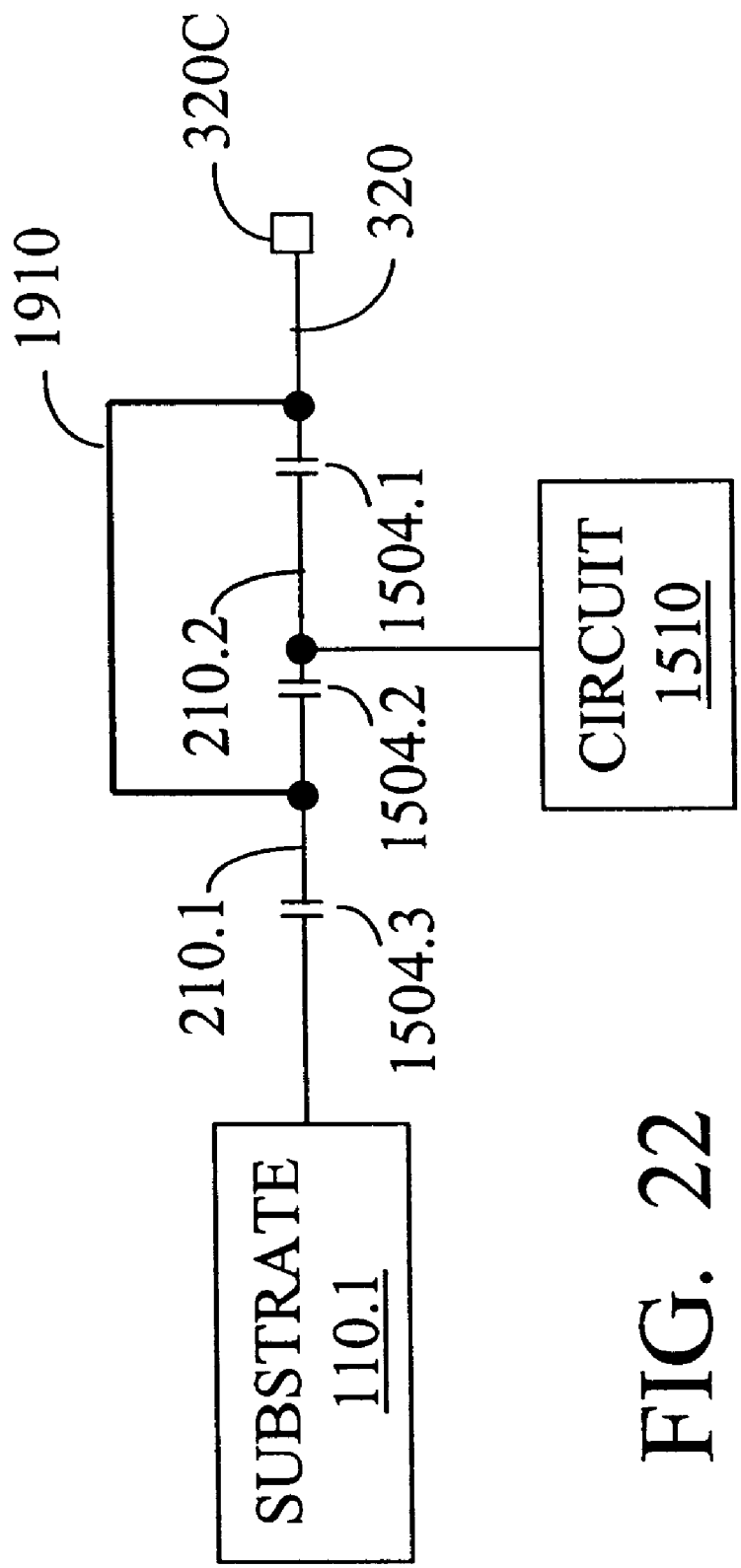

FIG. 22 is a circuit diagram for the structure of FIG. 16. Capacitor 1504.1 is formed by conductive layers 320, 210.2 and insulator 310.2. Capacitor 1504.2 formed by conductive layers 210.2, 210.1 and insulator 310.1. Capacitor 1504.3 is formed by layer 210.1, substrate region 110.1, and insulator 1110.

Any one or more of capacitors 1504.1, 1504.2, 1504.3 can be junction capacitors or rectifiers.

The capacitor plates can be interconnected. FIG. 22, the layers 320, 210.1 are connected together, as shown by a line 1910, so that the capacitors 1504.1, 1504.2 are connected in parallel between contact pad 320C and conductor 210.2 which is connected to a circuit 1510. Connection 1910 can be made outside of the opening 130. Connection 1910 can be a permanent connection. Alternatively, connection 1910 can be programmable (e.g. using a fuse or an antifuse), to allow the capacitance to be adjusted during or after manufacturing. Connection 1910 can be realized by means of contact openings (not shown) etched outside of opening 130 and allowing the layers 320, 210.1 to contact each other directly or through some other layer or layers.

Any number of layers 210 can be used to form any number of capacitors and rectifiers between contact pad 320C and substrate 110 and to provide desired electromagnetic shielding. Connections 1910 can be used to obtain a desired network.

Figure 23A:
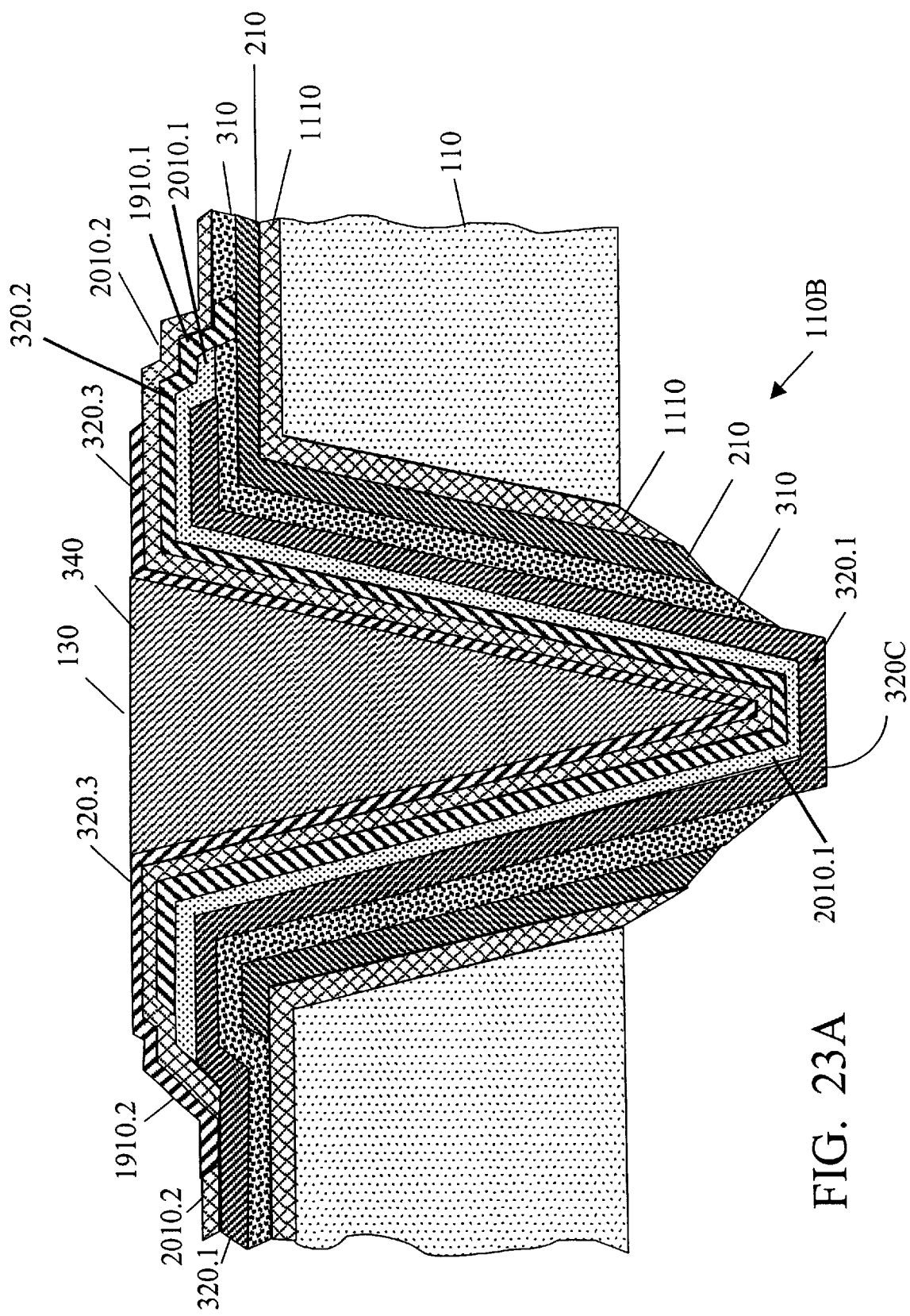
FIG. 23A is a vertical cross-sectional view of a structure according to the present invention.

FIG. 23A illustrates another type of capacitor structure. The structure is manufactured as follows:

1. One or more openings 130 are formed in the front side of substrate 110, as in FIGS. 1–17.

2. Optionally, insulating layer 1110 is formed as in FIG. 16.

3. One or more conductive layers 210 are formed in the openings as in FIG. 15 or 16. Only one such layer is shown in FIG. 23A. Insulating layers 310 (such as 310.1, 310.2 in FIG. 16) can optionally be formed between layers 210.

4. Optionally, insulator 310 is formed in the opening over the layers 210, using the same techniques as in FIG. 15.

5. Conductive layer 320.1 is formed using techniques described above for layer 320 of FIG. 3–16.

6. Insulating layer 2010.1 is formed using techniques described above for layer 310 (FIG. 15).

7. Step 5 is repeated to form conductive layer 320.2, then step 6 is repeated to form insulating layer 2010.2, then step 5 is repeated to form conductive layer 320.3.

8. Optionally, the openings 130 are filled with some material 340 (as in FIG. 3). The openings can also be filled at step 7 with layer 320.3.

9. Then the wafer backside 11 OB is processed to expose the layer 320.1. This can be done by techniques described above in connection with FIGS. 4A–17. The exposed portion of layer 320.1 provides contact pad 320C. The wafer backside can be insulated as described above in connection with FIGS. 6–17.

Figure 23B:
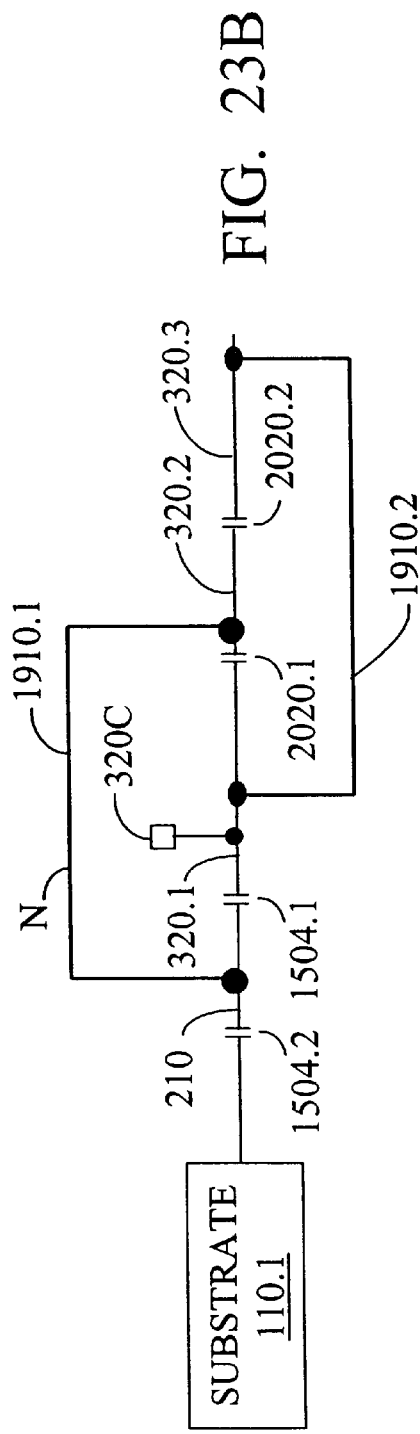
FIGS. 23B, 23C, 24 are circuit diagrams corresponding to structures according to the present invention.

FIG. 23B shows a circuit diagram for FIG. 23A. Layers 320.1, 310, 210 form a capacitor 1504.1. Layers 210, 1110, and substrate region 110.1, form a capacitor 1504.2 (if region 110.1 is made conductive by doping). Layers 320.1, 2010.1, 320.2 form a capacitor 2020.1. Layers 320.2, 2010.2, 320.3 form a capacitor 2020.2.

Permanent or programmable connections 1910 can be formed outside of openings 130 between selected conductive layers. In FIG. 23A, a permanent connection 1910.1 connects layer 320.2 to layer 210. Hence, capacitors 2020.1, 1504.1 are connected in parallel between the pad 320C and an electrical node N formed by layers 210, 320.2. A permanent connection 1910.2 connects layer 320.3 to layer 320.1, increasing the total capacitance between pad 320C and node N.

Figure 23C:
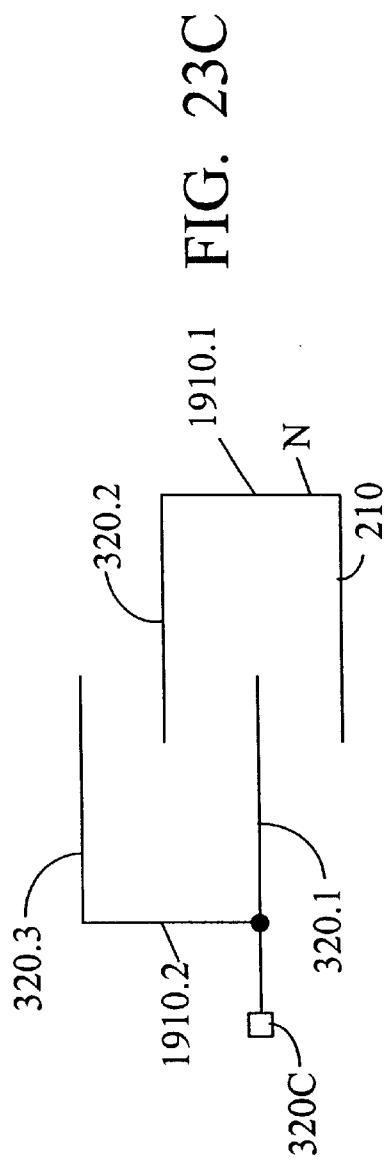

FIG. 23C is another circuit representation of the structure of FIG. 23A. Capacitors 2020.1, 2020.2 can be viewed as a single capacitor having: (i) one conductive plate having "fingers" 320.1, 320.3, and (ii) another conductive plate having "fingers" 210, 320.2. These interleaving fingers overlay each other, forming an interdigitated structure as seen in the vertical cross section. This helps explain why a large capacitance can be obtained in a small area.

Steps 5 and 6 can be repeated to form any number of layers 320, 2010, and thus any number of capacitors 2020. One or more of insulating layers 2010 can be omitted, and one or more of the elements 2020 can be junction capacitors or rectifiers. Layer 310 can be omitted and a junction capacitor or rectifier can be formed by layers 320.1, 210.

In some embodiments, any one or more of layers 1110, 210, 310, 320, 2010 are present in some openings 130 but not in the other openings 130 in the same structure. For example, some of these layers can be etched out of some of the openings. Alternatively, these layers can be formed selectively in some but not all of the openings. Layers 210 provide electromagnetic shielding for substrate 110.

Figure 24:
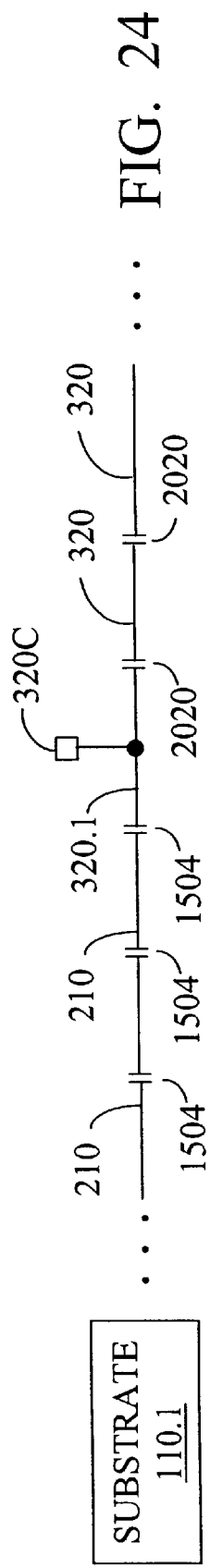

As illustrated in FIG. 24, any number of layers 210 and any number of layers 320 can be provided to obtain a large number of capacitive networks and a large variety of electromagnetic shielding parameters in a small area. Rectifiers or junction capacitors can be obtained if one or more of insulating layers 310, 2010, 1110 are omitted.

The invention is not limited to processes, materials, dimensions, and structures described above. For example, non-silicon semiconductor materials are used in some embodiments. Other embodiments and variations are within the scope of the invention, as defined by the appended claims.

What is claimed is:

1. A circuit structure comprising a semiconductor substrate, an opening passing through the substrate between a first side of the substrate and a second side of the substrate, and a plurality of conductive layers which overlay sidewalls of the opening, wherein the conductive layers include a first conductive layer and a second conductive layer which are separated by an insulating layer in the opening;

wherein the first conductive layer surrounds the second conductive layer in the opening;

wherein at least a portion of the second conductive layer is located at the second side;

wherein said portion is not covered, when viewed from the second side, by either said substrate, or said insulating layer, or the first conductive layer; and wherein said portion is not covered, when viewed from the first side, by either said substrate, or said insulating layer, or the first conductive layer.

2. The circuit structure of claim 1 wherein said portion of the second conductive layer on the second side provides an input, output, or input/output terminal of an integrated circuit.

3. The circuit structure of claim 1 further comprising an insulator insulating the first conductive layer from the sidewalls of the opening.

4. The circuit structure of claim 1 wherein the conductive layers include one or more conductive layers surrounding the first conductive layer in the opening and insulated from the first conductive layer in the opening.

5. The structure of claim 1 wherein the first conductive layer comprises a doped region of the semiconductor substrate on the sidewalls of the opening.

6. The structure of claim 1 wherein the conductive layers include a third conductive layer surrounded by the first and second conductive layers in the opening and filling the opening, wherein at least a portion of the third conductive layer is not covered, when viewed from either the first side or the second side, by either said substrate, or by said insulating layer, or by the first and second conductive layers.

7. The circuit structure of claim 4 wherein said portion is not covered, when viewed from either the first side or the second side, by any one of said conductive layers surrounding the first conductive layer in the opening.

8. The circuit structure of claim 1 wherein the plurality of conductive layers include one or more conductive layers surrounded by the first and second conductive layers in the opening and separated from the first and second conductive layers by one or more insulating layers in the opening.

9. The circuit structure of claim 1 wherein the plurality of conductive layers include two or more conductive layers surrounded by the first and second conductive layers in the opening and separated from each other, and from the first and second conductive layers, by insulating layers in the opening.

10. The circuit structure of claim 1 further comprising circuitry for holding the first conductive layer in the opening at a constant voltage.

11. The circuit structure of claim 1 wherein the substrate has been processed to form at least a poriton of a circuit element over the first side of the substrate and a transistor region in the substrate.

12. A circuit structure comprising:
a semiconductor substrate which has been processed to form at least a portion of a circuit element above the substrate;
an opening passing through the substrate between a top side of the substrate and a bottom side of the substrate, and a plurality of conductive layers which overlay sidewalls of the opening, wherein he conductive layers include a first conductive layer and a second conductive layer which are separated by an insulating layer in the opening;
wherein the first conductive layer surrounds the second conductive layer in the opening;
wherein at least a portion of the second conductive layer is located on the bottom side of the substrate;
wherein said portion is not covered, when viewed from below the substrate, by either said substrate, or said insulating layer, or the first conductive layer.

13. The circuit structure of claim 12 wherein the substrate comprises a transistor region.

14. The circuit structure of claim 12 wherein said portion of the second conductive layer on the bottom side of the substrate provides an input, output, or input/output terminal of an integrated circuit.

15. The circuit structure of claim 12 further comprising an insulator insulating the first conductive layer from the sidewalls of the opening.

16. The circuit structure of claim 12 wherein:
the conductive layers include one or more conductive layers surrounding the first conductive layer in the opening and insulated from the first conductive layer in the opening; and
said portion is not covered, when viewed from the bottom side of the substrate, by any one of said conductive layers surrounding the first conductive layer in the opening.

17. The structure of claim 12 wherein the first conductive layer comprises a doped region of the semiconductor substrate on the sidewalls of the opening.

18. The structure of claim 12 wherein the conductive layers include a third conductive layer surrounded by the first and second conductive layers in the opening and filling the opening, wherein at least a portion of the third conductive layer is not covered, when viewed from the bottom side of the substrate, by either said substrate, or by said insulating layer, or by the first and second conductive layers.

19. The circuit structure of claim 12 wherein the plurality of conductive layers include one or more conductive layers surrounded by the first and second conductive layers in the opening and separated from the first and second conductive layers by one or more insulating layers in the opening.

20. The circuit structure of claim 12 wherein the plurality of conductive layers include two or more conductive layers surrounded by the first and second conductive layers in the opening and separated from each other, and from the first and second conductive layers, by insulating layers in the opening.

21. The circuit structure of claim 12 further comprising circuitry for holding the first conductive layer in the opening at a constant voltage.

22. The circuit structure of claim 4 further comprising an insulator insulating the sidewalls of the opening from the one or more conductive layers surrounding the first conductive layer.

23. The circuit structure of claim 2 wherein said terminal protrudes out of the opening on the second side of the substrate.

24. The circuit structure of claim 23 wherein the insulating layer protrudes out of the opening on the second side of the substrate, but the protrusion of the insulating layer is not as large as the protrusion of said terminal.

25. The circuit structure of claim 24 wherein the first conductive layer protrudes out of the opening on the second side of the substrate, but the protrusion of the first conductive layer is not as large as the protrusion of the insulating layer.

26. The circuit structure of claim 23 wherein the first conductive layer does not protrude out of the opening on the second side but is recessed on the second side relative to the semiconductor substrate.

27. The circuit structure of claim 1 wherein the second conductive layer protrudes out of the opening on the first and second sides.

28. The circuit structure of claim 27 wherein the second conductive layer protrudes out of the insulating layer in the opening on the first and second sides.

29. The circuit structure of claim 28 wherein the insulating layer protrudes out of the first conductive layer in the opening on the first and second sides.

30. The circuit structure of claim 29 wherein the first conductive layer protrudes out of the opening on the first and second sides.

31. The circuit structure of claim 27 wherein the first conductive layer does not protrude out of the opening on the second side but is recessed relative to the substrate on the second side.

32. The circuit structure of claim 16 further comprising an insulator insulating the sidewalls of the opening from the one or more conductive layers surrounding the first conductive layer.

33. The circuit structure of claim 12 wherein the second conductive layer protrudes out of the opening on the second side of the substrate.

34. The circuit structure of claim 33 wherein the insulating layer protrudes out of the opening on the second side of the substrate, but the protrusion of the insulating layer is not as large as the protrusion of the second conductive layer.

35. The circuit structure of claim 34 wherein the first conductive layer protrudes out of the opening on the second side of the substrate, but the protrusion of the first conductive layer is not as large as the protrusion of the insulating layer.

36. The circuit structure of claim 12 wherein the first conductive layer does not protrude out of the opening on the second side but is recessed on the second side relative to the semiconductor substrate.

37. A circuit structure comprising a semiconductor substrate, an opening passing through the substrate between a first side of the substrate and a second side of the substrate, and a plurality of conductive layers which overlay sidewalls of the opening, wherein the conductive layers include a first conductive layer and a second conductive layer which are separated by an insulating layer in the opening;

wherein the first conductive layer surrounds the second conductive layer in the opening;

wherein the first conductive layer extends out of the opening over the first side of the substrate;

wherein at least a portion of the second conductive layer is located at the second side;

wherein said portion is not covered, when viewed from the second side, by either said substrate, or said insulating layer, or the first conductive layer.

38. The circuit structure of claim 37 wherein the second conductive layer does not overlie the substrate on the second side outside of the opening.

39. The circuit structure of claim 38 wherein the first conductive layer does not overlie the substrate on the second side outside of the opening.

40. The circuit structure of claim 37 wherein the opening is wider at the first side than at the second side.

41. The circuit structure of claim 37 wherein the substrate comprises a transistor region.

42. The circuit structure of claim 37 wherein said portion of the second conductive layer on the second side of the substrate provides an input, output, or input/output terminal of an integrated circuit.

43. The circuit structure of claim 37 further comprising an insulator insulating the first conductive layer from the sidewalls of the opening.

44. The circuit structure of claim 37 wherein:

the conductive layers include one or more conductive layers surrounding the first conductive layer in the opening and insulated from the first conductive layer in the opening; and said portion is not covered, when viewed from the second side of the substrate, by any one of said conductive layers surrounding the first conductive layer in the opening.

45. The structure of claim 37 wherein the first conductive layer comprises a doped region of the semiconductor substrate on the sidewalls of the opening.

46. The structure of claim 37 wherein the conductive layers include a third conductive layer surrounded by the first and second conductive layers in the opening and filling the opening, wherein at least a portion of the third conductive layer is not recovered, when viewed from the second side of the substrate, by either said substrate, or by said insulating layer, or by the first and second conductive layers.

47. The circuit structure of claim 37 wherein the plurality of conductive layers include one or more conductive layers surrounded by the first and second conductive layers in the opening and separated from the first and second conductive layers by one or more insulating layers in the opening.

48. The circuit structure of claim 37 wherein the plurality of conductive layers include two or more conductive layers surrounded by the first and second conductive layers in the opening and separated from each other, and from the first and second conductive layers, by insulating layers in the opening.

49. The circuit structure of claim 37 further comprising circuitry for holding the first conductive layer in the opening at a constant voltage.

50. The circuit structure of claim 49 further comprising insulator insulating the sidewalls of the opening from the one or more conductive layers surrounding the first conductive layer.

* * * * *